(12) United States Patent
Pyo

(10) Patent No.: US 11,825,619 B2
(45) Date of Patent: Nov. 21, 2023

(54) DISPLAY DEVICE

(71) Applicant: LG ELECTRONICS INC., Seoul (KR)

(72) Inventor: Jonggil Pyo, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 18/100,443

(22) Filed: Jan. 23, 2023

(65) Prior Publication Data

US 2023/0164937 A1 May 25, 2023

Related U.S. Application Data

(63) Continuation of application No. 17/139,386, filed on Dec. 31, 2020, now Pat. No. 11,632,866.

(30) Foreign Application Priority Data

Dec. 31, 2019 (WO) ................ PCT/KR2019/018799

(51) Int. Cl.
*H05K 7/02* (2006.01)
*H05K 5/02* (2006.01)
(Continued)

(52) U.S. Cl.
CPC ......... *H05K 5/0217* (2013.01); *H02K 7/1166* (2013.01); *H02K 11/22* (2016.01);
(Continued)

(58) Field of Classification Search
CPC ... H05K 5/0217; H05K 5/0017; H05K 7/1166
(Continued)

(56) References Cited

U.S. PATENT DOCUMENTS 10,687,428 B2  6/2020 Kim et al.
2011/0132557 A1  6/2011 Kuroi et al.
(Continued)

FOREIGN PATENT DOCUMENTS

KR  20170006012  1/2017
KR  20170124120  11/2017
(Continued)

OTHER PUBLICATIONS

United States Patent and Trademark Office U.S. Appl. No. 17/139,386, Office Action dated Jan. 21, 2022, 8 pages.
(Continued)

*Primary Examiner* — Hung S. Bui
(74) *Attorney, Agent, or Firm* — LEE, HONG, DEGERMAN, KANG & WAIMEY

(57) ABSTRACT

A display device comprising a flexible display panel, a panel roller, a frame, a first foldable link comprising one end pivotably coupled to the frame and another end pivotably coupled to a lower side of the flexible display panel, a second foldable link having one end pivotably coupled to the frame and the other end pivotably coupled adjacent to the lower side of the flexible display panel, wherein the second foldable link is located opposite to the first foldable link, a motor, a first gear box and comprising at least one gear configured to cause the first foldable link to pivot, a second gear and comprising at least one gear configured to pivot with respect to the second foldable link, and a driving shaft configured to transmit power to at least one gear of the first gear box or to the at least one gear of the second gear box.

12 Claims, 34 Drawing Sheets

(51) Int. Cl.
*H05K 5/00* (2006.01)
*H02K 7/116* (2006.01)
*H02K 11/22* (2016.01)
*H10K 50/84* (2023.01)
*H10K 77/10* (2023.01)
*H10K 102/00* (2023.01)

(52) U.S. Cl.
CPC .......... *H05K 5/0017* (2013.01); *H10K 50/84* (2023.02); *H10K 77/111* (2023.02); *H10K 2102/311* (2023.02)

(58) Field of Classification Search
USPC ........................................................ 361/807
See application file for complete search history.

(56) References Cited

U.S. PATENT DOCUMENTS

| | | | |
|---|---|---|---|
| 2017/0318693 A1* | 11/2017 | Kim | ................ H02K 11/21 |
| 2018/0070467 A1 | 3/2018 | Kim et al. | |
| 2020/0201394 A1 | 6/2020 | Choi | |
| 2021/0204427 A1 | 7/2021 | Pyo | |

FOREIGN PATENT DOCUMENTS

| | | |
|---|---|---|
| KR | 20180045980 | 5/2018 |
| KR | 102031910 | 10/2019 |

OTHER PUBLICATIONS

PCT International Application No. PCT/KR2019/018799, International Search Report dated Sep. 25, 2020, 4 pages.

* cited by examiner

DISPLAY DEVICE

CROSS-REFERENCE TO RELATED APPLICATIONS

This application is a continuation of U.S. patent application Ser. No. 17/139,386, filed on Dec. 31, 2020, which claims the benefit of an earlier filing date and right of priority to International Application No. PCT/KR2019/018799, filed on Dec. 31, 2019, the contents of which are hereby incorporated by reference herein in its entirety.

BACKGROUND OF THE INVENTION

1. Field of the Invention

The present disclosure relates to a display device.

2. Description of the Related Art

As the information society has developed, the demand for display device is increasing in various forms, and accordingly, in recent years, various display devices such as a liquid crystal display (LCD), plasma display panel (PDP), electroluminescent display (ELD), vacuum fluorescent display (VFD), and the like have been studied and used.

Thereamong, a display device using an organic light emitting diode (OLED) has excellent luminance and viewing angle characteristics in comparison with a liquid crystal display device and does not require a backlight unit, thereby being implemented in an ultrathin type.

In addition, a flexible display panel can be bent or wound around a roller. The flexible display panel may be used to implement a display device that unfolds on a roller or winds around the roller. Many studies have been made on a structure for winding a flexible display panel around a roller or unwinding the flexible display panel from the roller.

SUMMARY OF THE INVENTION

It is an object of the present disclosure to solve the above and other problems.

It is another object of the present disclosure to secure structural rigidity for preventing drooping of a display device.

It is another object of the present disclosure to secure structural rigidity for preventing twisting of the display device.

It is a further object of the present disclosure to provide a driving mechanism of a rollable display device.

In accordance with the present disclosure, the above and other objects can be accomplished by the provision of a display device including a flexible display panel, a panel roller, wherein the flexible display panel is wound around or unwound from the panel roller, a frame extending in a longitudinal direction with respect to the panel roller, wherein the panel roller is coupled to the frame, a first foldable link comprising one end pivotably coupled to the frame and another end pivotably coupled adjacent to a lower side of the flexible display panel, a second foldable link having one end pivotably coupled to the frame and the other end pivotably coupled adjacent to the lower side of the flexible display panel, wherein the second foldable link is located opposite to the first foldable link, a motor mounted to the frame between the first foldable link and the second foldable link, a first gear box mounted to the frame adjacent to the first foldable link, and comprising at least one gear configured to cause the first foldable link to pivot, a second gear box mounted to the frame adjacent to the second foldable link, and comprising at least one gear configured to pivot with respect to the second foldable link, and a driving shaft configured to transmit power provided by the motor to the at least one gear of the first gear box or to the at least one gear of the second gear box.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE PREFERRED EMBODIMENTS

Figure 1:
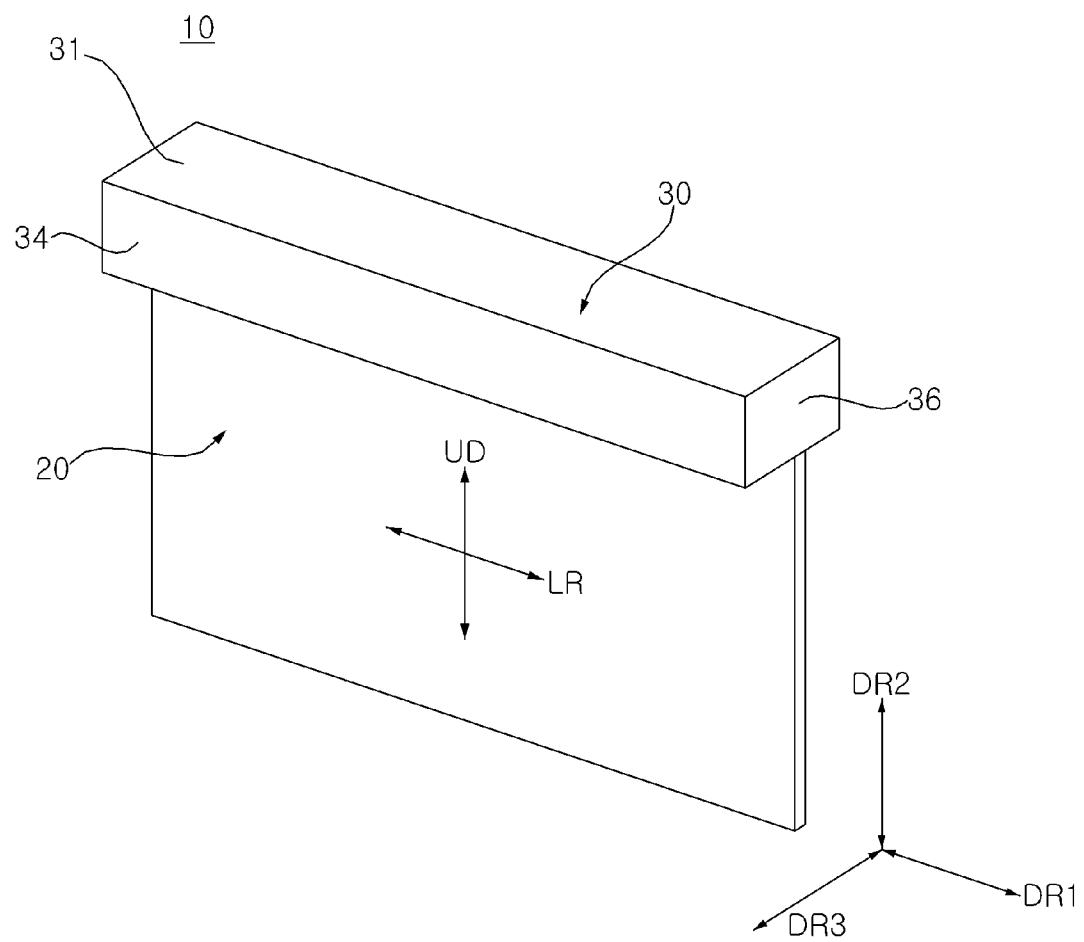
FIGS. 1 to 34 are views showing examples of a display device according to embodiments of the present disclosure.

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another. It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the following description, even if an embodiment is described with reference to a specific figure, if necessary, reference numeral not shown in the specific figure may be referred to, and reference numeral not shown in the specific figure is used when the reference numeral is shown in the other figures.

For horizontally symmetrical or vertically symmetrical components shown in the drawings referred to in the following description, the description of a one-side part of each component may be equally applied to the description of an other-side part thereof.

Referring to FIG. 1, a display device 10 may include a display unit 20 and a housing 30. The housing 30 may have an internal space. At least a portion of the display unit 20 may be located inside the housing 30. At least a portion of the display unit 20 may be located outside the housing 30. The display unit 20 may display a screen.

The direction parallel to the longitudinal direction of the housing 30 may be referred to as a first direction DR1, a leftward direction, or a rightward direction. The direction in which the display unit 20 displays a screen may be referred to as a forward direction or the front. The direction opposite to the direction in which the display unit 20 displays the screen may be referred to as a rearward direction or the rear. The direction parallel to the height direction of the display device 10 may be referred to as a second direction DR2, an upward direction, or a downward direction.

A third direction DR3 may be a direction perpendicular to the first direction DR1 and/or the second direction DR2. The first direction DR1 and the second direction DR2 may be collectively referred to as a horizontal direction. In addition, the third direction DR3 may be referred to as a vertical direction. A leftward-rightward direction LR may be parallel to the first direction DR1, and an upward-downward direction UD may be parallel to the second direction DR2.

Figure 2:
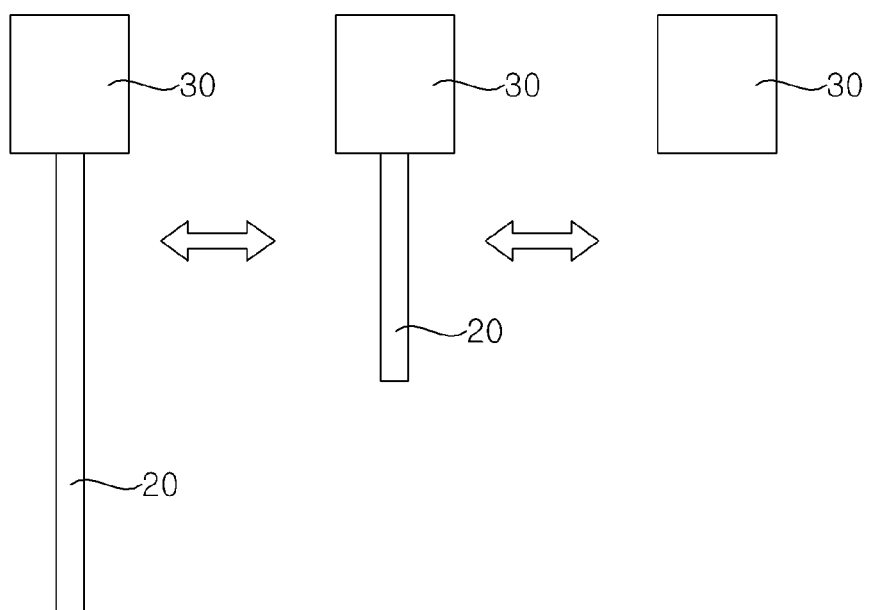

Referring to FIG. 2, the display unit 20 may be entirely located inside the housing 30. At least a portion of the display unit 20 may be located outside the housing 30. The degree to which the display unit 20 is exposed to the outside of the housing 30 may be adjusted as necessary.

Figure 3:
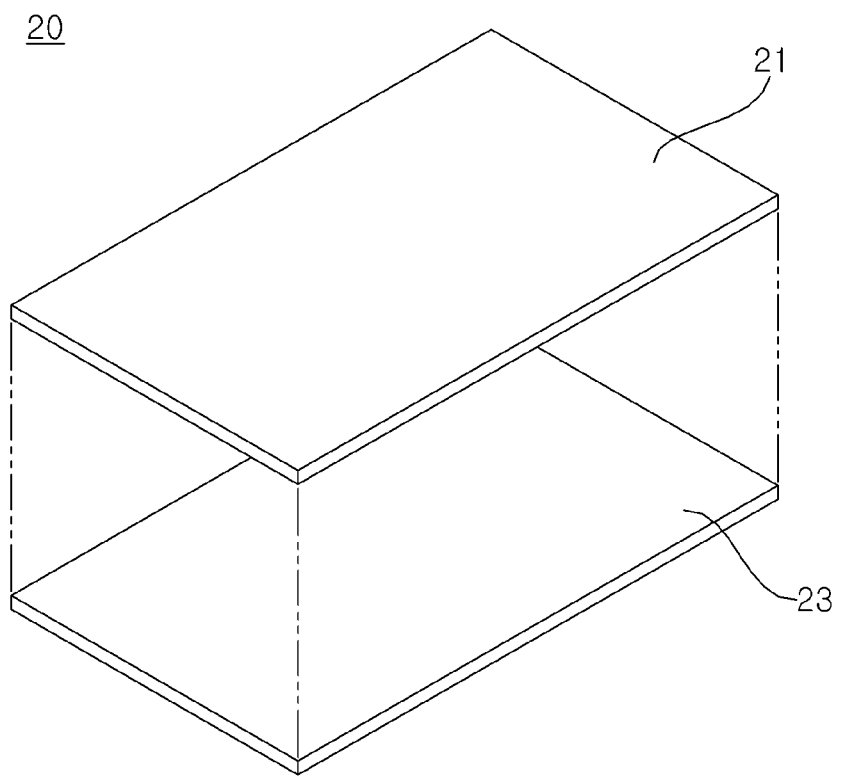

Referring to FIG. 3, the display unit 20 may include a display panel 21 and a plate 23. The display panel 21 may be flexible. For example, the display panel 21 may be an organic light emitting display (OLED).

The display panel 21 may have a front surface for displaying an image. The display panel 21 may have a rear surface facing the front surface. The front surface of the display panel 21 may be covered with a light transmissive material. For example, the light transmissive material may be a synthetic resin or film.

The plate 23 may be coupled, fastened, or attached to the rear surface of the display panel 21. The plate 23 may include a metal material. The plate 23 may be referred to as a module cover 23, a cover 23, a display panel cover 23, a panel cover 23, or an apron 23.

Figure 4:
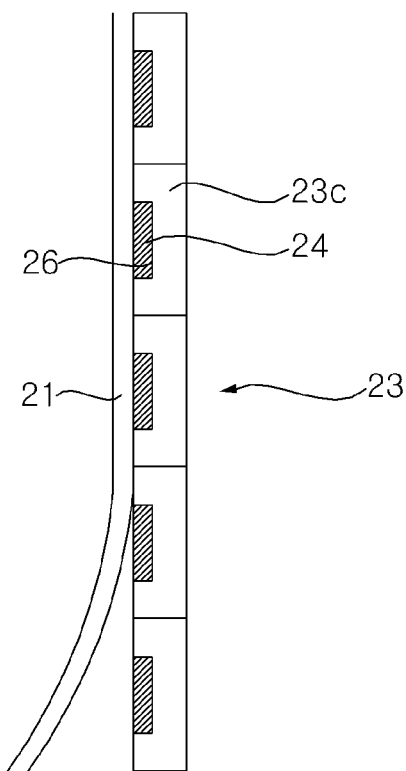

Referring to FIG. 4, the plate 23 may include a plurality of segments 23c. A magnet 24 may be located inside a recess 26 of the segment 15c. The recess 26 may be located on a surface of the segment 23c facing the display panel 21. The recess 26 may be located in the front surface of each segment 23. Since the magnet 24 is accommodated inside the recess 26, the magnet 24 may not protrude from the segment 23c. The display panel 21 may be flat without being wrinkled even when it is in contact with the segment 23c.

Figure 5:
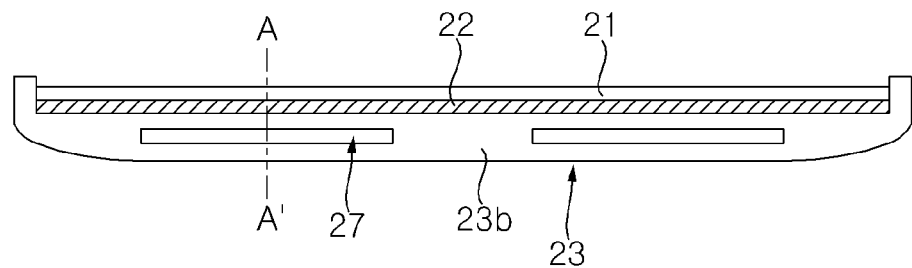
Figure 5:
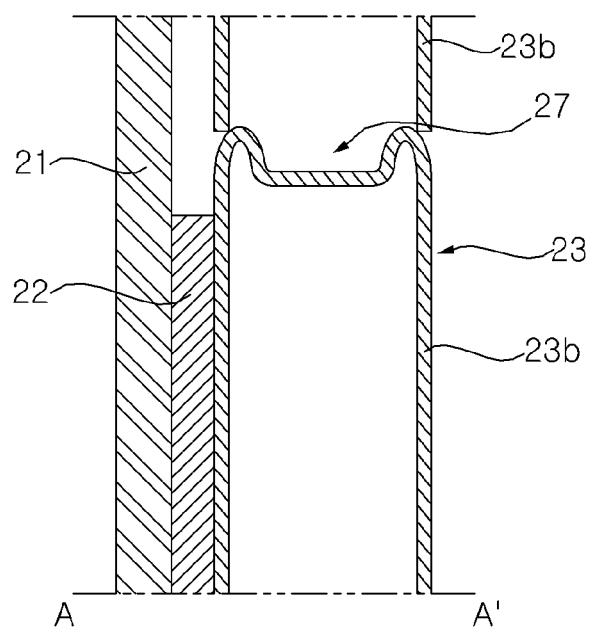

Referring to FIG. 5, a bead 27 may be formed in the upper surface of the segment 23b. The bead 27 may have a shape recessed inwardly of the segment 23b. For example, the bead 27 may be formed by pressing the segment 23b. A plurality of beads 27 may be formed on the segment 23b. The plurality of beads 27 may be spaced apart from each other. The bead 27 may enhance the rigidity of the segment 23b. The bead 27 can prevent the shape of the segment 23b from being deformed due to external impact. The segment 23b may be fixed to the rear of the display panel 21 via an adhesive member 22. For example, the adhesive member 22 may be double-sided tape.

Figure 6:
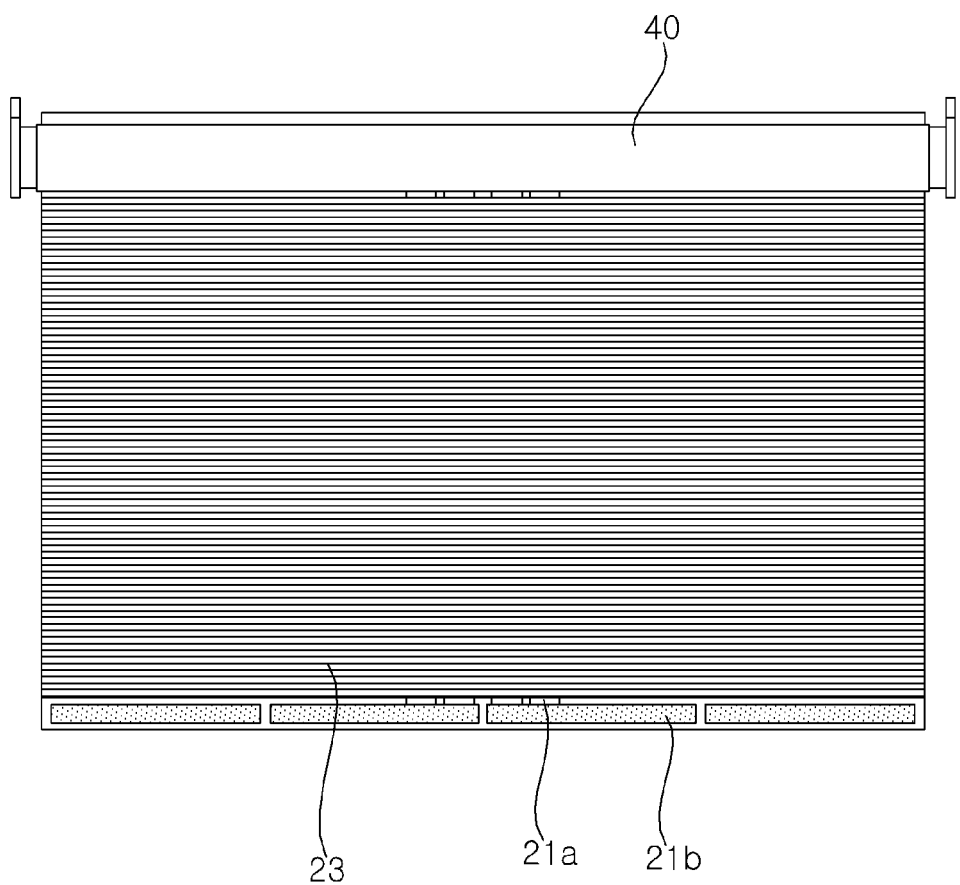

Referring to FIG. 6, a source PCB 21b may be located under the module cover 23. In the case of roll-down or roll-up, the position of the source PCB 21b may be changed with the movement of the module cover 23. An FFC cable 21a may be located in the central part of the module cover 23 in the first direction. The FFC cable 21a may be located in both ends of the module cover 23 in the first direction.

Figure 7:
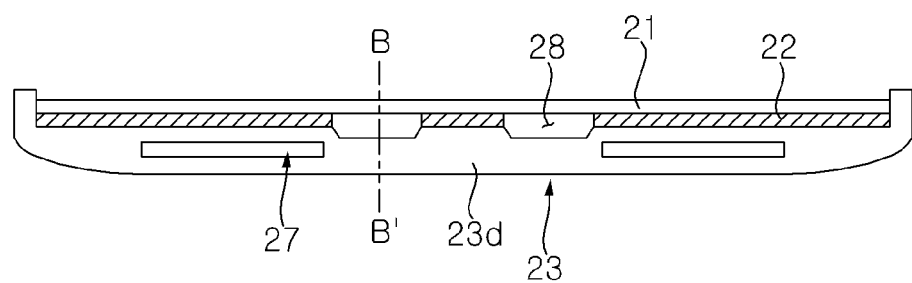
Figure 7:
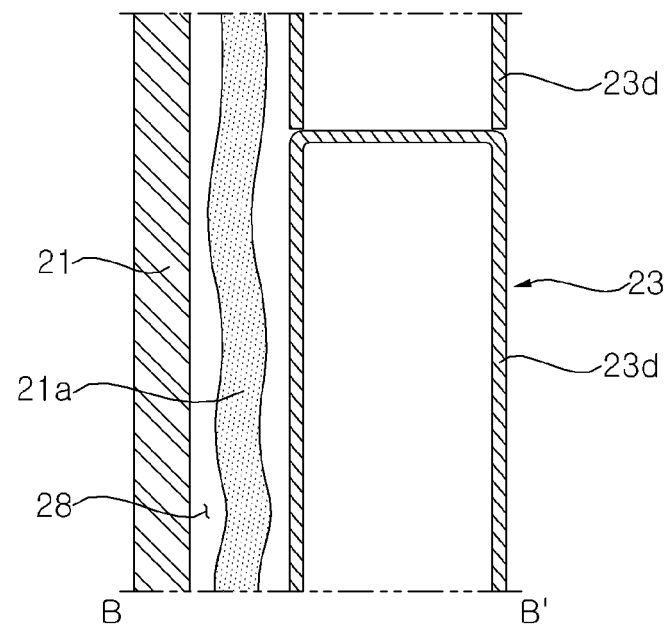

Referring to FIG. 7, a segment 23d may include a depression 28 recessed inwardly of the segment 23d. The depression 28 may form a space between the display panel 21 and the module cover 23. The FFC cable 21a may be accommodated in a space formed by the depression 28. In addition, the depression 28 may improve the rigidity of the segment 23d.

The bead 27 may be located on the segment 23d excluding a portion where the depression 28 is located. The position of the depression 28 may not overlap the position of the bead 27 in order to prevent a reduction in rigidity of the segment 23d.

Figure 8:
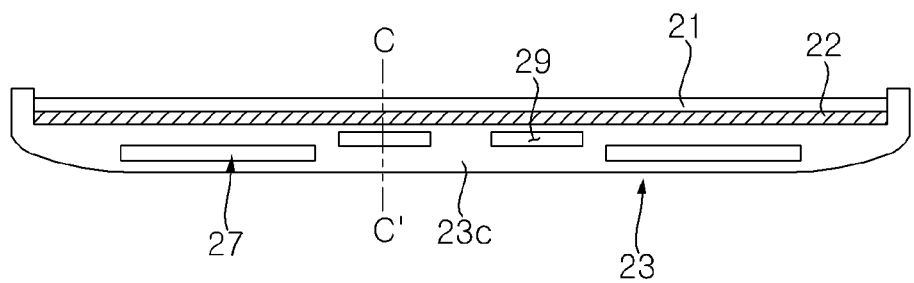
Figure 8:
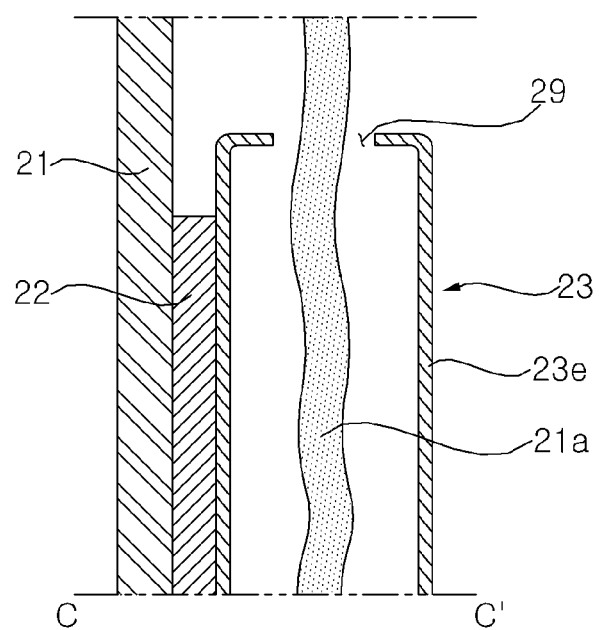

Referring to FIG. 8, a penetrating portion 29 may be located at the central part of a segment 23e in the first direction. The penetrating portion 29 may penetrate the central part of the segment 23e in the second direction. That is, the penetrating portion 29 may be a hole located in the segment 23e. The penetrating portion 29 may be a portion where the FFC cable 21a is located. Since the penetrating portion 29 is formed in the segment 23e, the thickness of the segment 23e may be reduced in comparison with the case where the FFC cable 21a is located in the depression 28 (see FIG. 7).

The bead 27 may be located on the segment 23e excluding a portion where the penetrating portion 29 is located. The position of the penetrating portion 29 may not overlap the position of the bead 27 in order to prevent a reduction in rigidity of the segment 23e.

Figure 9:
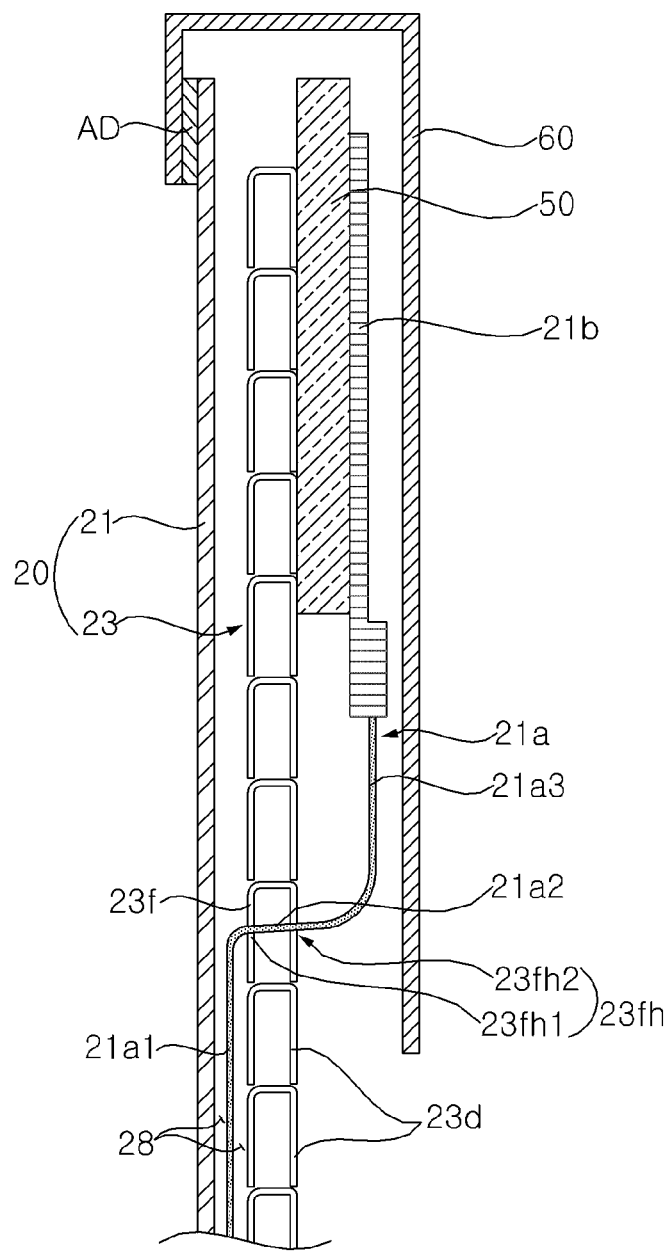

Referring to FIG. 9, a top case 60 may cover the source PCB 21b and a bar 50 as well as the display panel 21 and the module cover 23. One surface of the bar 50 may be coupled to the rear surface of the module cover 23, and the other surface thereof may be coupled to the source PCB 21b. The bar 50 may be fixed to the module cover 23 to support the source PCB 21b.

Figure 10:
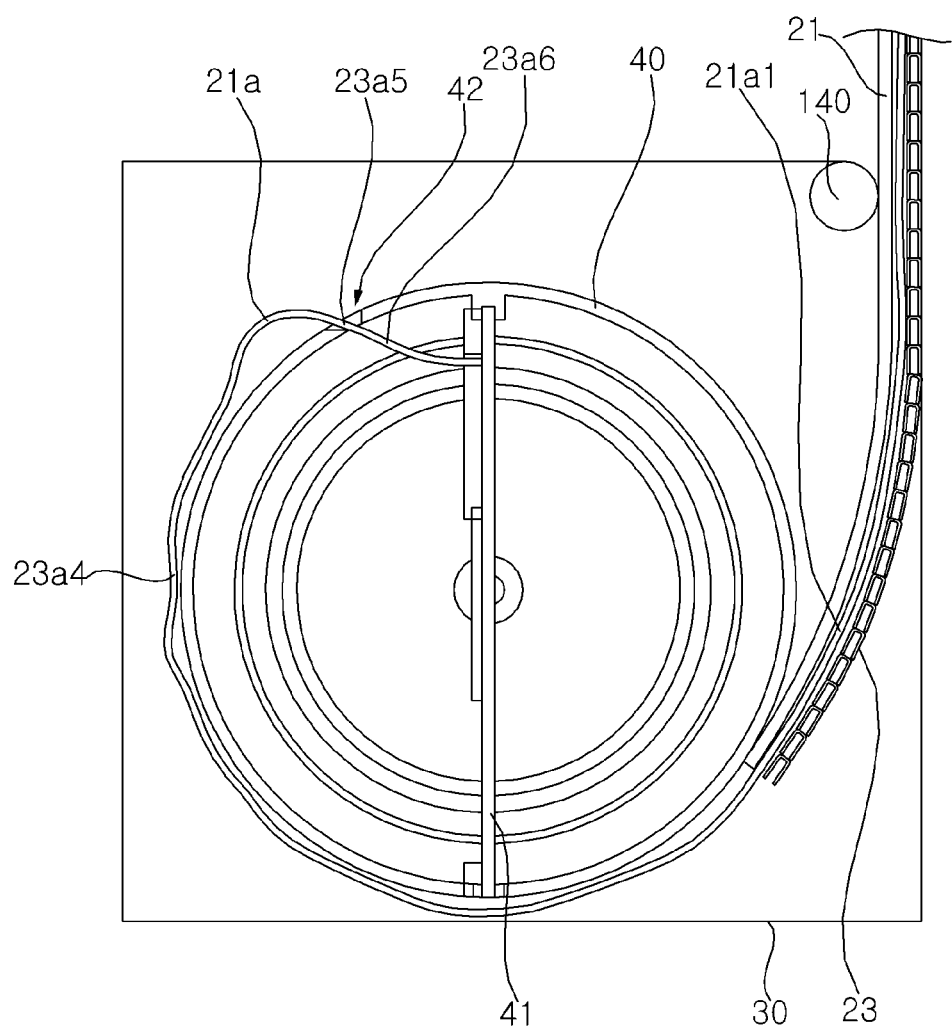

The distal end of the FFC cable 21a may be connected to a timing controller board 41 (see FIG. 10) inside a roller 40 (see FIG. 10). The FFC cable 21a may be wound around or unwound from the roller 40 together with the display unit 20.

A portion of the FFC cable 21a may be located between the display panel 21 and the module cover 23. The portion of the FFC cable 21a located between the display panel 21 and the module cover 23 may be referred to as a first portion 21a1. The first portion 21a1 may be located in the depression 28 formed by the plurality of segments 23d. Alternatively, the first portion 21a1 may be accommodated in the depression 28 formed by the plurality of segments 23d.

A portion of the FFC cable 21a may penetrate a segment 23f. The portion of the FFC cable 21a that passes through the segment 23f may be referred to as a second portion 21a2. The segment 23f may include a first hole 23fh1 formed in the front surface and a second hole 23fh2 formed in the rear surface. The first hole 23fh1 and the second hole 23fh2 may be connected to each other to form a single hole 23fh. The hole 23fh may penetrate the segment 23f in the third direction. The second portion 21a2 may extend through the hole 23fh. The hole 23fh may be referred to as a connection hole 23fh.

The distal end of the FFC cable 21a may be electrically connected to the source PCB 21b. A part of the FFC cable 21a may be located in the rear surface of the module cover 23. The portion of the FFC cable 21a located in the rear surface of the module cover 23 may be referred to as a third portion 21a3. The third portion 21a3 may be electrically connected to the source PCB 21b.

The third portion 21a3 may be covered by the top case 60. Accordingly, the third portion 21a3 may not be exposed to the outside.

Referring to FIG. 10, the FFC cable 21a may be connected to the timing controller board 41 mounted in the roller 40. A penetrating hole 42 may be formed on the roller 40, and the FFC cable 21a may be connected to the timing controller board 41 through the penetrating hole 42.

The penetrating hole 42 may be located in one side of the roller 40 and may penetrate an outer circumferential portion of the roller 40. The FFC cable 21a may be connected to one side of the timing controller board 41 through the penetrating hole 42.

Even when the FFC cable 21a is located in the outer circumference of the roller 40, it may maintain the connection with the timing controller board 41 due to the penetrating hole 42. Accordingly, the FFC cable 21a may rotate together with the roller 40 to prevent twisting.

A portion of the FFC cable 21a may be wound around the roller 40. The portion of the FFC cable 21a wound around the roller 40 may be referred to as a fourth portion 23a4. The fourth portion 23a4 may be in contact with the outer circumferential surface of the roller 40.

A portion of the FFC cable 21a may pass through the penetrating hole 42. The portion of the FFC cable 21a passing through the penetrating hole 42 may be referred to as a fifth portion 23a5.

The distal end of the FFC cable 21a may be electrically connected to the timing controller board 41. A portion of the FFC cable 21a may be located inside the roller 40. The portion of the FFC cable 21a located inside the roller 40 may be referred to as a sixth portion 23a6. The sixth portion 23a6 may be electrically connected to the timing controller board 41.

Figure 11:
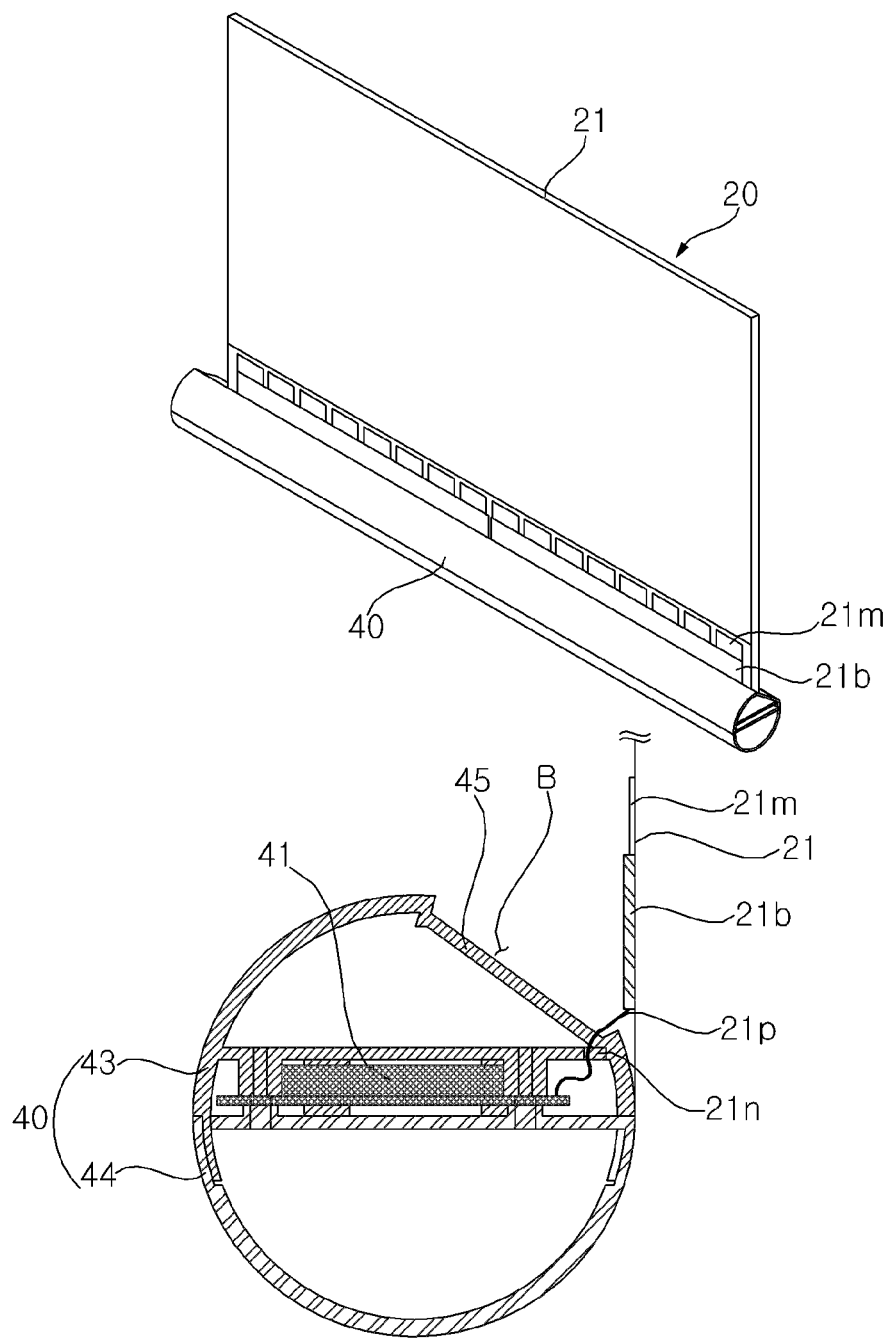

Referring to FIG. 11, the display panel 21 may be connected to the roller 40. The display panel 21 may be wound around or unwound from the roller 40. The display panel 21 may be electrically connected to the plurality of source PCBs 21b. The plurality of source PCBs 21b may be spaced apart from each other.

A source chip on film (COF) 21m may connect the display panel 21 and the source PCB 21b. The source COF 21M may be located at a long side of the display panel 21. The roller 40 may include a first part 43 and a second part 44. The first part 43 and the second part 44 may be fastened by a screw. The timing controller board 41 may be mounted in the roller 40.

The source PCB 21b may be electrically connected to the timing controller board 41. The timing controller board 41 may send digital video data and a timing control signal to the source PCB 21b.

The cable 21p may electrically connect the source PCB 21b and the timing controller board 41. For example, the cable 21p may be a flexible flat cable (FFC). The cable 21p may penetrate a hole 21n. The hole 21n may be formed in a seating portion 45 or the first part 43. The cable 21p may be located between the display panel 21 and the second part 44.

The seating portion 45 may be formed in an outer circumference of the first part 43. The seating portion 45 may be formed by stepping a portion of the outer circumference of the first part 43. The seating portion 45 may form a space B. When the display unit 20 is wound around the roller 40, the source PCB 21b may be accommodated in the seating portion 45. Since the source PCB 21b is accommodated in the seating portion 45, the source PCB 21b may not be twisted or bent, and durability may be improved.

Figure 12:
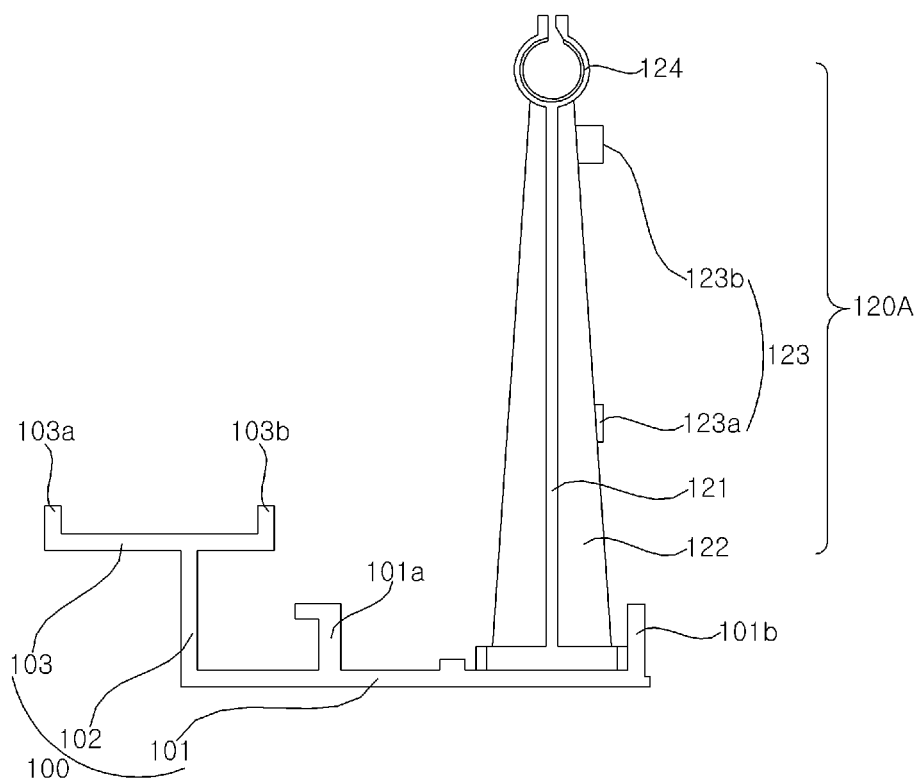

Referring to FIG. 12, a frame 100 may include a first base 101, a second base 103, and a vertical portion 102. The frame 100 may be referred to as a main frame. The frame 100 may be mounted in the housing 300 (see FIG. 1). The frame 100 may extend long in the leftward-rightward direction LR of the housing 30, and may be mounted to the housing 300.

The first base 101 may be a long plate. The vertical portion 102 may extend from a long side of the first base 101 in the longitudinal direction of the first base 101. A first rib 101a and a second rib 101b may be formed on the first base 101. The first rib 101a may be located adjacent to the vertical portion 102, and the second rib 101b may be opposite the vertical portion 102 with respect to the first rib 101a.

The second base 103 may be formed at the distal end of the vertical portion 102. The second base 103 may have a third rib 103a and a fourth rib 103b. The third rib 103a may be formed at the distal end of one long side of the second base 103, and the fourth rib 103b may be formed at the distal end of the other long side of the second base 103. Consequently, it is possible to secure rigidity of the frame 100 against drooping or bending.

Figure 13:
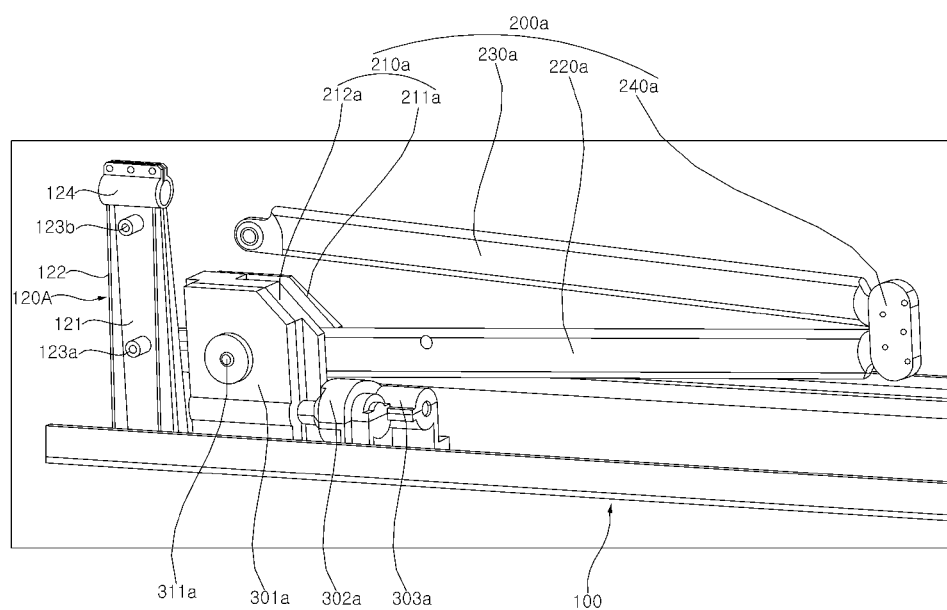

Referring to FIGS. 12 and 13, a tower 120A may be mounted on the frame 100. The tower 120A may be referred to as a sub frame 120A. The tower 120A may include a first beam 121, a second beam 122, and a clamp 124. The first beam 121 may extend long in the upward-downward direction UD. The second beam 122 may extend long in the upward-downward direction UD while intersecting the first beam 121. The width of the second beam 122 may gradually decrease in the longitudinal direction. A plurality of second beams 122 may be provided. The clamp 124 may be formed at the distal end of the tower 120A. Bosses 123a and 123b may be formed at the side surface of the tower 120A. A plurality of bosses 123a and 123b may be provided. The first boss 123a may be located adjacent to the middle of the first beam 121, and the second boss 123a may be located at the first beam 121 so as to be adjacent to the clamp 124.

Referring to FIG. 13, a link mount 210a may be mounted on the frame 100. For example, the link mount 210a may be mounted on the first base 101 (see FIG. 14). The link mount 210a may include a first part 211a and a second part 212a. The first part 211a may be a plate, and the second part 212a may be a plate. The first part 211a may be spaced apart from the second part 212a by a predetermined distance.

Links 220a and 230a may include an upper arm 230a and a lower arm 220a. The upper arm 230a may be referred to as a first arm 230a, and the lower arm 220a may be referred to as a second arm 220a. One end of the upper arm 230a may be connected to one end of the lower arm 220a via a joint 240a. The other end of the lower arm 220a may be pivotably coupled to the link mount 210a. For example, the other end of the lower arm 220a may be inserted between the first part 211a and the second part 212a, and may be axially coupled to the first part 211a and the second part 212a so as to rotate about a shaft 311a. A first gear box 301a may be installed at the link mount 210a. A second gear box 302a and/or a third gear box 303a may be mounted on the first base 101 of the frame 100.

Figure 14:
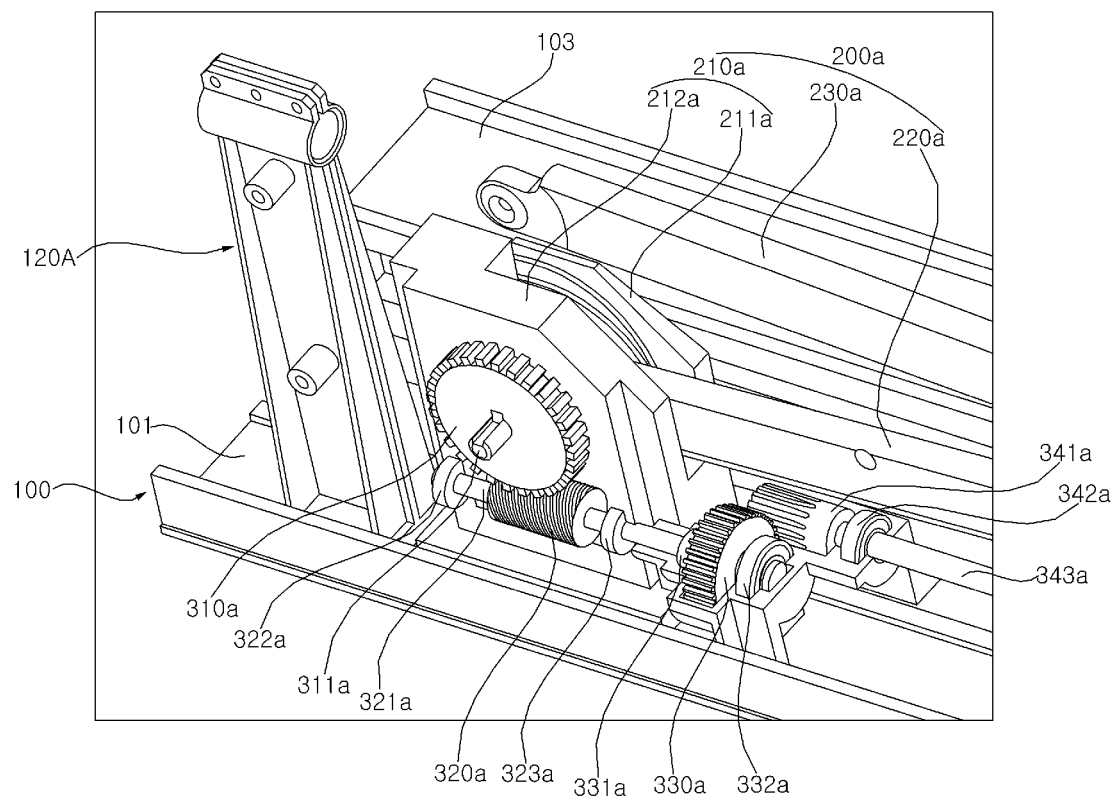

Referring to FIG. 14, a link gear 310a and a worm gear 320 may be mounted in the first gear box 301a. The link gear 310a may be engaged with the worm gear 320. The worm gear 320a may be rotatably installed in the first gear box 301a. A transmission shaft 321a may be rotatably installed in the first gear box 301a. The transmission shaft 321a may be inserted into a first bearing 322a and a second bearing 323a. The worm gear 320a may be fixed to the transmission shaft 321a between the first bearing 322a and the second bearing 323a. The first bearing 322a and the second bearing 323a may be fixed to the first gear box 301a. The second gear box 302a may be mounted on the first base 101 of the frame 100 in the state of being adjacent to the first gear box 301a.

The transmission shaft 321a may be rotatably installed in the second gear box 302a. A third bearing 332a may be fixed in the second gear box 302a. The third bearing 332a may be located adjacent to the distal end of the transmission shaft 321a. A first transmission gear 330a may be rotated with the transmission shaft 321a. The first transmission gear 330a may be located between the third bearing 332a and the second bearing 323a.

The third gear box 303a may be mounted on the first base 101 of the frame 100 in the state of being adjacent to the second gear box 302a. A driving shaft 343a may be rotated in the third gear box 303a. A fourth bearing 342a may be fixed in the third gear box 303a. The driving shaft 343a may be inserted into the fourth bearing 342a so as to be rotated in the fourth bearing 342a. The driving shaft 343a may be inserted into a second transmission gear 341a. The second transmission gear 341a may be rotated with the driving shaft 343a. The second transmission gear 341a may be engaged with the first transmission gear 330a. The first transmission gear 330a may be referred to as a driving gear 330a.

Figure 15:
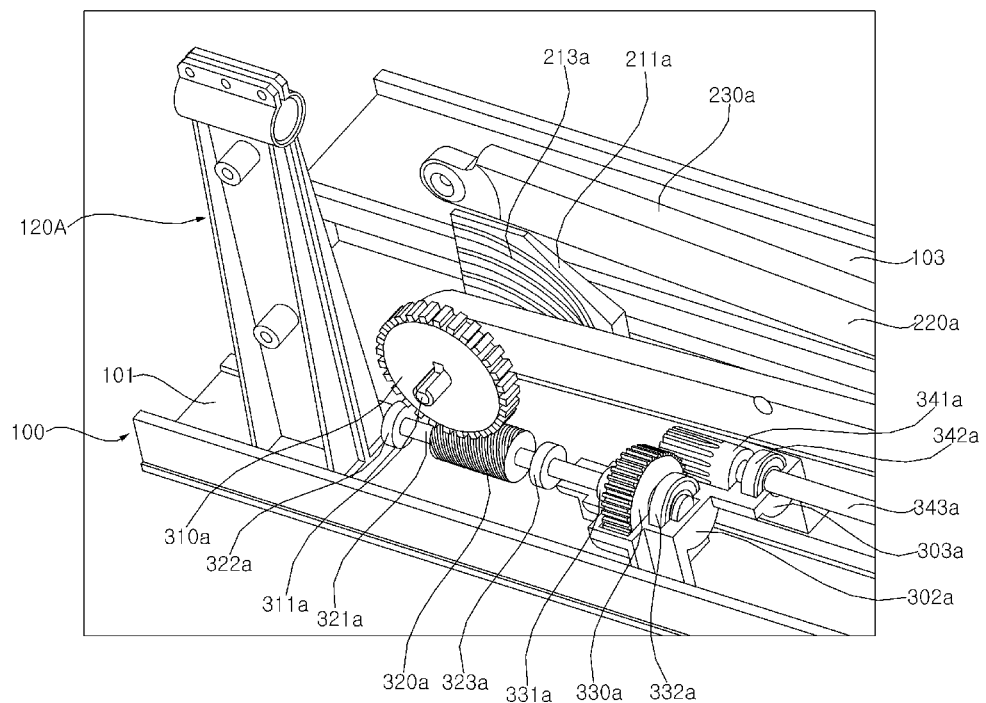

Referring to FIG. 15, a guide rail 213a may be located at the inner surface of the first part 211a and/or the second part 212a. The guide rail 213a may be fixed to the first part 211a and/or the second part 212a. The lower arm 220a may be turned about the shaft 311a on the guide rail 213a while being engaged with the guide rail 213a. When the links 220a and 230a are driven, therefore, the links 220a and 230a may move along a predetermined track without shaking or twisting.

Figure 16:
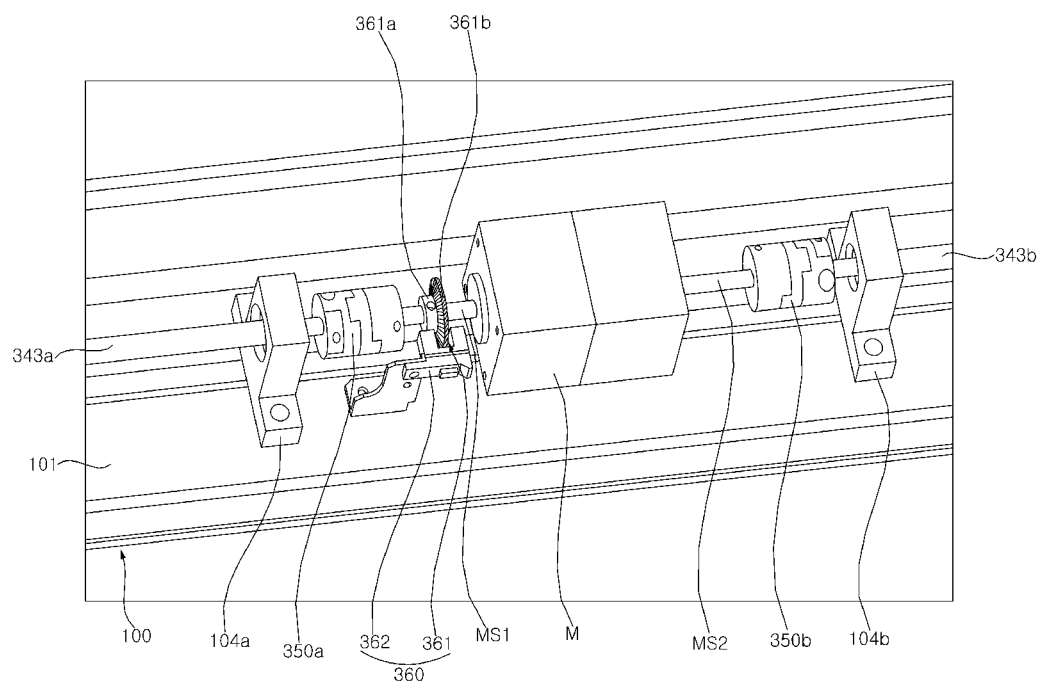

Referring to FIG. 16, a motor M may be mounted on the first base 101 of the frame 100. Motor shafts MS1 and MS2 may be installed at opposite sides of the motor M, whereby power may be provided to the opposite sides of the motor M. A left driving shaft 343a may be connected to the left motor shaft MS1 of the motor M, and a right driving shaft 343b may be connected to the right motor shaft MS2 of the motor M. A left coupling 350a may connect the left driving shaft 343a and the left motor shaft MS1 to each other. For example, couplings 350a and 350b may be universal joints. The left driving shaft 343a may be rotatably inserted into a left support 104a so as to be rotatable.

The left support 104a may be mounted on the first base 101 of the frame 100, and may support the left driving shaft 343a. The right driving shaft 343b may be rotatably inserted into a right support 104b so as to be rotatable. The right support 104b may be mounted on the first base 101 of the frame 100, and may support the right driving shaft 343b.

The left motor shaft MS1 may be inserted into a sensor plate 361. The sensor plate 361 may be rotated with the left motor shaft MS1. For example, the sensor plate 361 may have a disc-shaped rotator 361a and a plurality of teeth 361b protruding from the outer circumferential surface of the rotator 361a in the radial direction. A sensor 362 may sense rotation of the sensor plate 361. For example, the sensor 362 may be a photo sensor. Consequently, the number of rotations of the motor M may be sensed.

Figure 17:
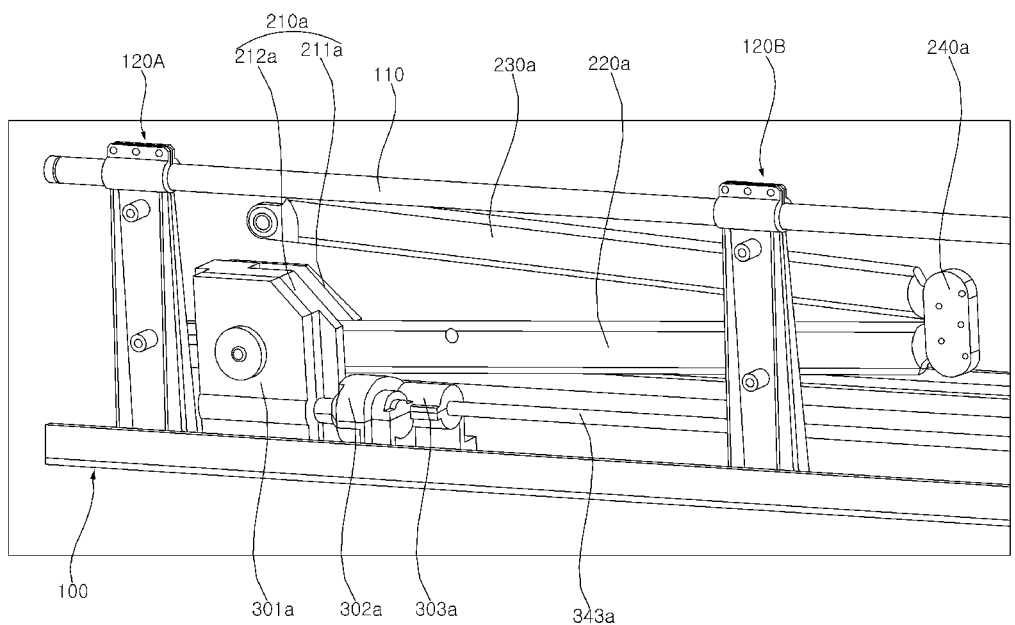
Figure 18:
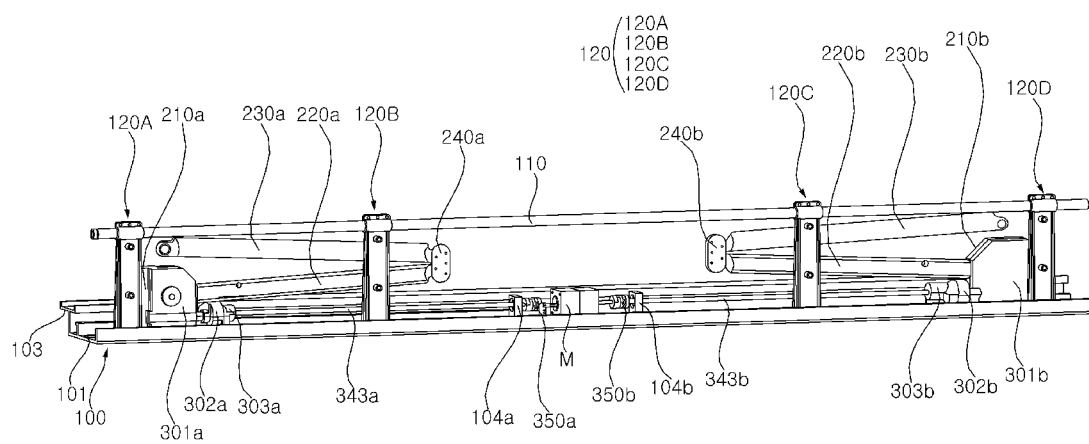

Referring to FIGS. 17 and 18, a pipe 110 may be coupled to the tower 120. The pipe 100 may extend long, and may be disposed parallel to the frame 100. The pipe 110 may be inserted into and fixed to the clamp 124 (see FIG. 12) of the tower 120. A plurality of towers 120 may be provided, and may be mounted on the first base 101 of the frame 100. The clamp 124 having the pipe inserted thereinto may be tightened by a fastening member.

A first tower 120A may be located at the left side of the frame 100. A fourth tower 120D may be located at the right side of the frame 100. A second tower 120B may be located between the first tower 120A and the fourth tower 120D, and a third tower 120C may be located between the second tower 120B and the fourth tower 120D. The number of towers 120 may be variously changed.

The distance between the first tower 120A and the second tower 120B may be substantially equal to the distance between the third tower 120C and the fourth tower 120D. The distance between the first tower 120A and the second tower 120B may be less than the distance between the second tower 120B and the third tower 120C.

Referring to FIG. 18, a left link mount 210a may be located between the first tower 120A and the second tower 120B so as to be adjacent to the first tower 120A. A right link mount 210b may be located between the third tower 120C and the fourth tower 120D so as to be adjacent to the fourth tower 120D. The motor M may be located between the second tower 120B and the third tower 120C.

A first left gear box 301a may be fixed on the left link mount 210a. A second left gear box 302a may be located among the left link mount 210a, the first left gear box 301a, and the second tower 120B so as to be adjacent to the first left gear box 301a. A third left gear box 303a may be located between the first left gear box 301a and the second tower 120B so as to be adjacent to the second left gear box 302a and the first left link mount 210a.

A first right gear box 301b may be fixed on the right link mount 210b. A second right gear box 302b may be located among the right link mount 210b, the first right gear box 301b, and the third tower 120C so as to be adjacent to the first right gear box 301b. A third right gear box 303b may be located between the first right gear box 301b and the third tower 120B so as to be adjacent to the second right gear box 302b and the first right link mount 210b.

The left driving shaft 343a may transmit power provided by the motor M to the third left gear box 303a. The right driving shaft 343b may transmit power provided by the motor M to the third right gear box 303b. The left driving shaft 343a may receive power from the motor via a left joint 350a while being supported by the left support 104a, and the right driving shaft 343b may receive power from the motor via a right joint 350b while being supported by the right support 104b.

Left links 220a, 230a, and 240a may be pivotably connected to the left link mount 210a, and may move downwards while being unfolded or upwards while being folded. Right links 220b, 230b, and 240b may be pivotably connected to the right link mount 210b, and may move downwards while being unfolded or upwards while being folded. The left links 220a, 230a, and 240a and the right links 220b, 230b, and 240b may move downwards to the same height while being unfolded or upwards to the same height while being folded.

Consequently, power transmission of the display device may be achieved in the minimum space at high efficiency.

Figure 19:
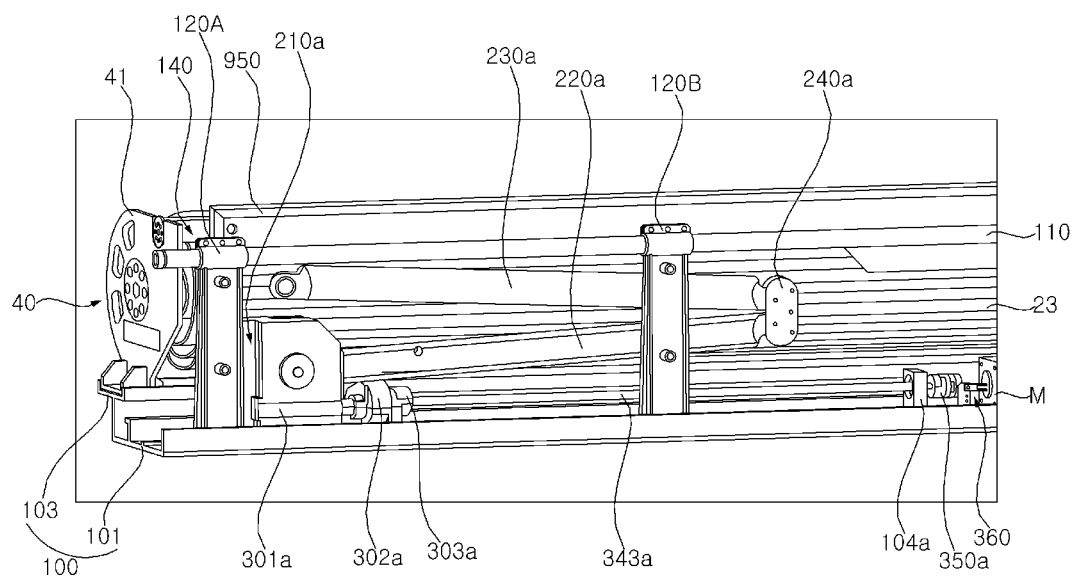
Figure 20:
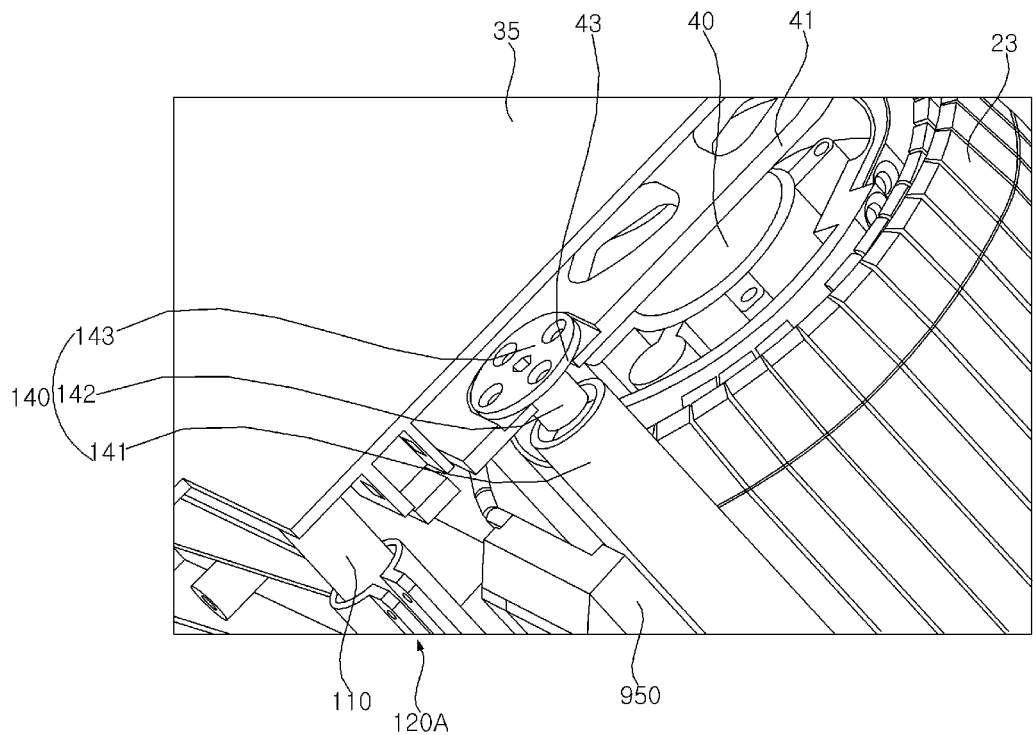

Referring to FIGS. 19 and 20, a panel roller 40 may be mounted on the frame 100. The panel roller 140 may be fixed on the first base 101. The panel roller 140 may be located in front of the towers 120 (see FIG. 18) and the pipe 110. A guide roller 140 may be coupled to a roller frame 41. The guide roller 140 may guide motion of the display panel 21 (see FIG. 10) and the module cover 23. The guide roller 140 may extend long in the leftward-rightward direction of the module cover 23.

The guide roller 140 may have a shaft 142, a roller 141, and a fixing plate 143. The shaft 142 may be supported by the roller frame 41. The roller frame 41 may have a shaft recess 43 formed by cutting out a portion of the roller frame 41, and the shaft 142 may be inserted into the shaft recess 43. The roller 141 may surround the outer circumferential surface of the shaft 142, and may be rotated in the shaft recess 43. The fixing plate 143 may be fixed to the roller frame 41 via a fastening member (not shown).

Figure 21:
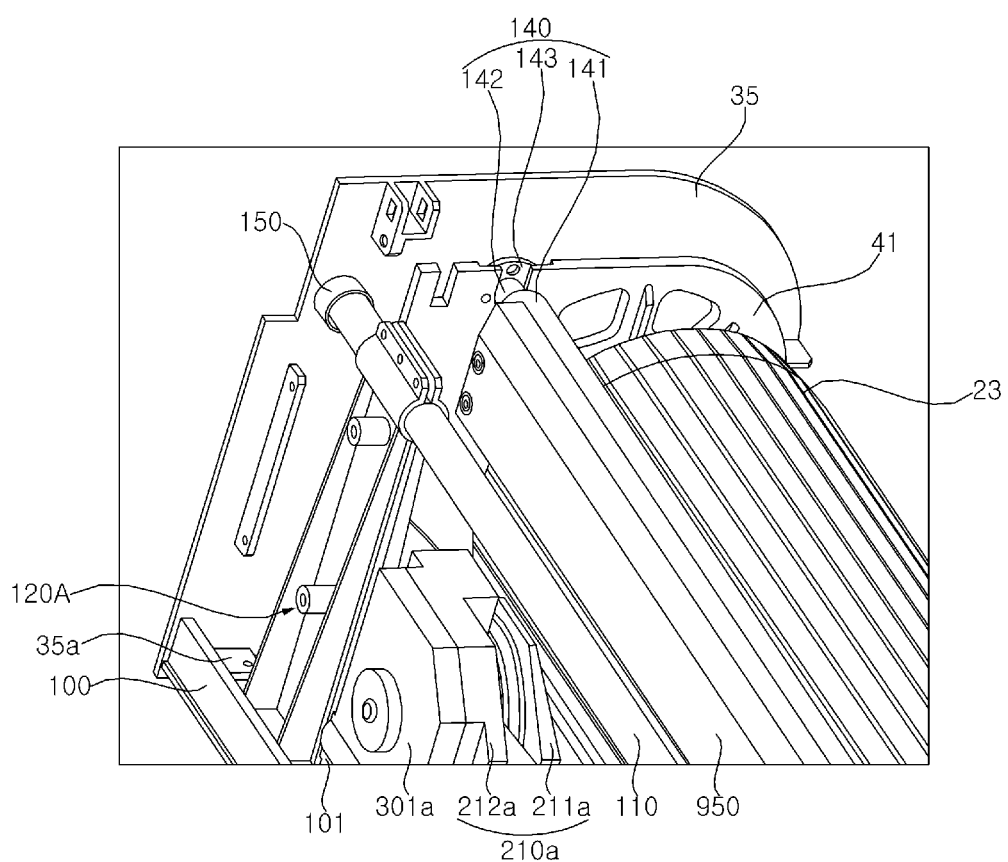
Figure 22:
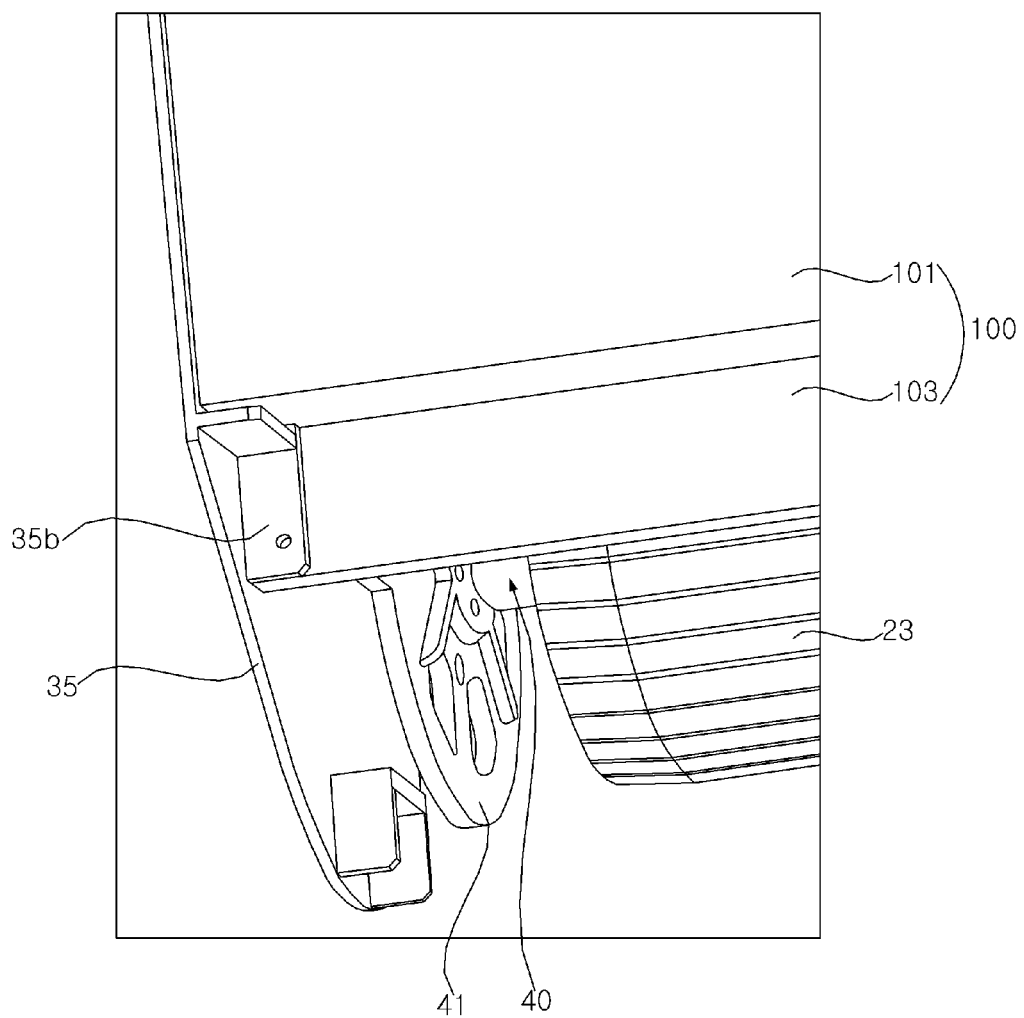

Referring to FIGS. 21 and 22, the side cover 35 may be coupled to the frame 100 and the pipe 110 while facing the outer surface of the roller frame 41. The side cover 35 may have a first fastening portion 35a. The first fastening portion 35a may be a plate protruding from the inner surface of the side cover 35. The first fastening portion 35a may be fixed to the inner surface of the first base 101 of the frame 100. For example, the first fastening portion 35a and the first base 101 of the frame 100 may be coupled to each other via a screw. The pipe 110 may be inserted into a coupling port 150 of the side cover 35, and may be fixed to the side cover 35. The side cover 35 may be referred to as a first side cover 35 or a left plate 35.

The side cover 35 may have a second fastening portion 35b. The second fastening portion 35b may be a plate protruding from the inner surface of the side cover 35. The second fastening portion 35b may be fixed to the outer surface of the second base 103 of the frame 100. For example, the second fastening portion 35b and the second base 103 of the frame 100 may be coupled to each other via a screw.

Consequently, rigidity of the display device against drooping and twisting may be secured.

Figure 23:
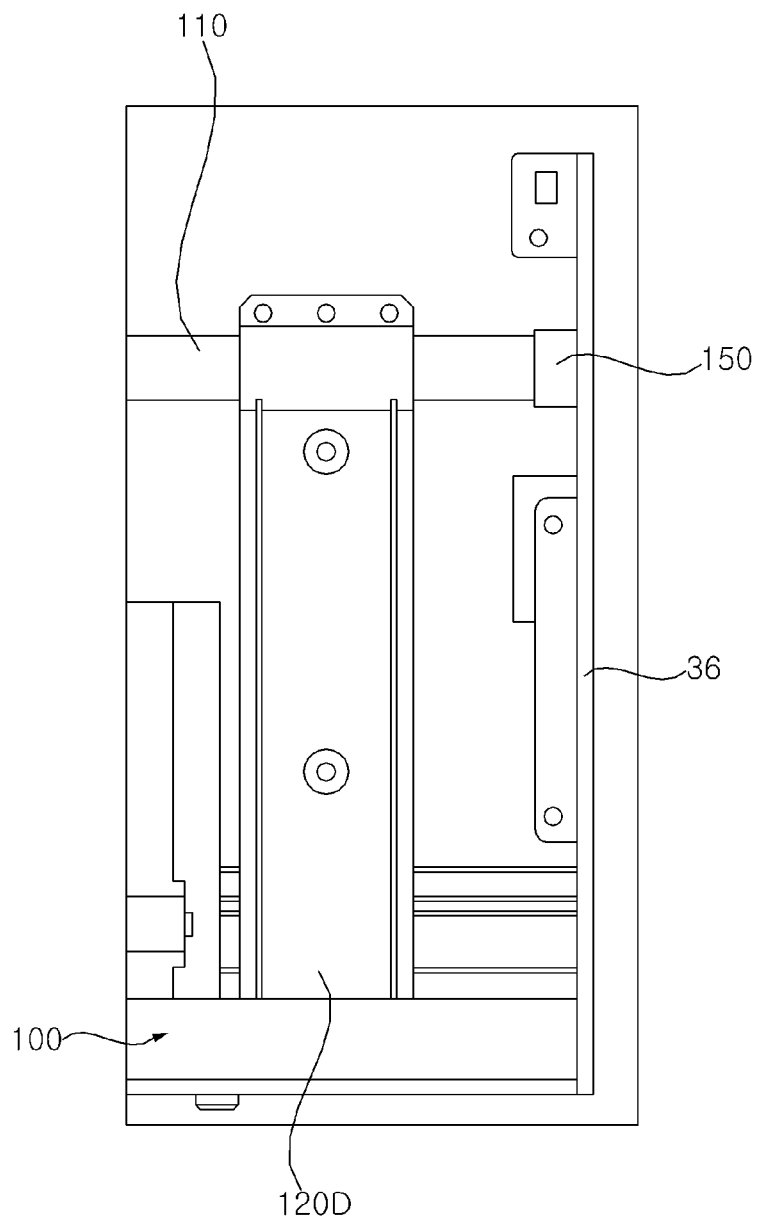

Referring to FIG. 23, the side cover 36 may be referred to as a second side cover 36 or a right plate 36. The description made with reference to FIGS. 21 and 22 may be equally applied to the construction and structure of the second side cover 36. At this time, the second side cover 36 may be symmetrical with the first side cover 35.

Consequently, it is possible to secure rigidity of the display device against drooping and to secure rigidity of the display device against twisting.

Figure 24:
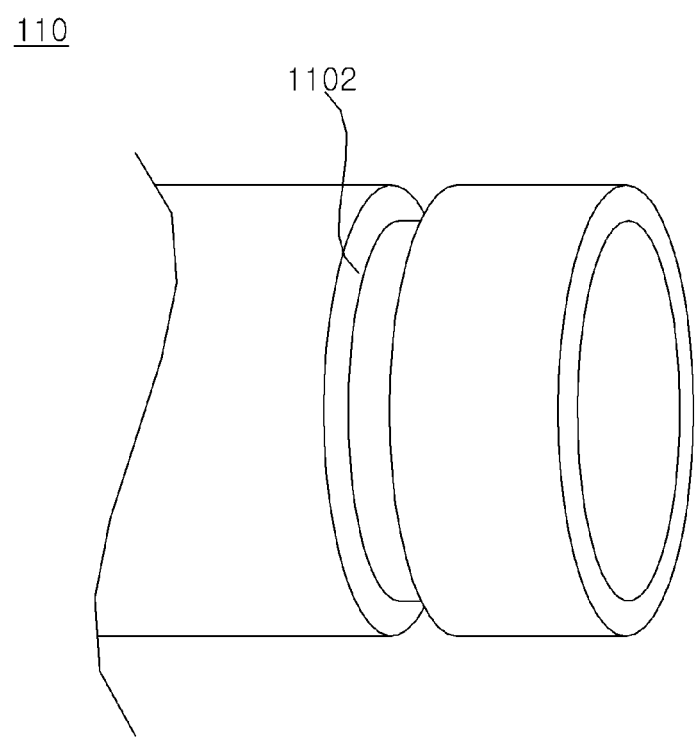
Figure 25:
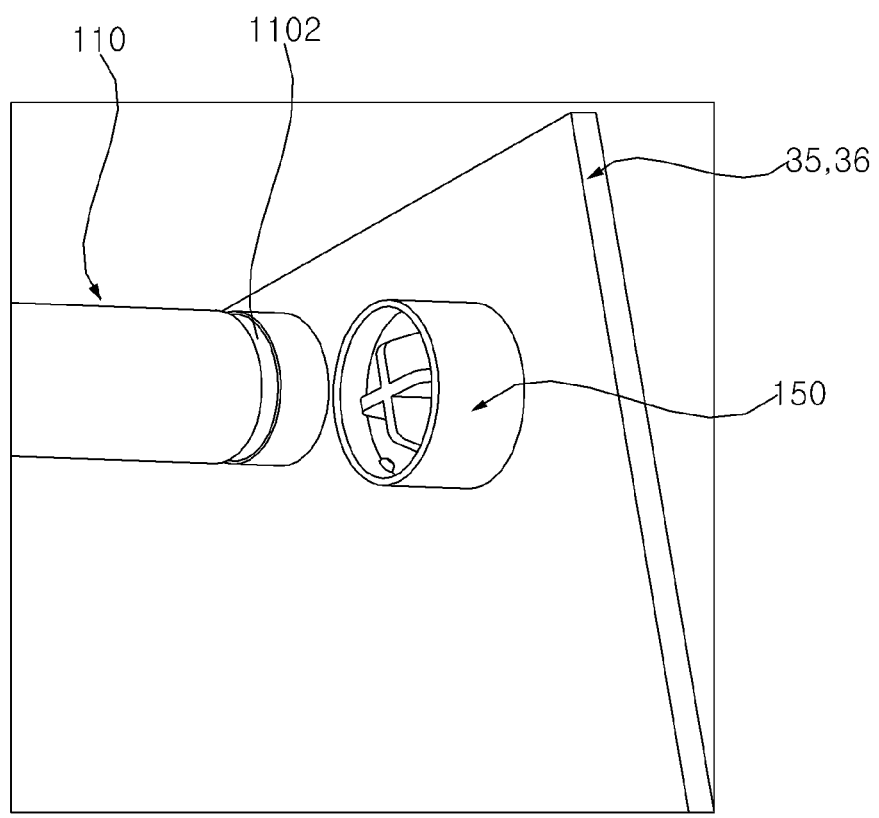

Referring to FIGS. 24 and 25, the pipe 110 may have a neck 1102 located adjacent to the distal end thereof, the neck 1102 being formed at the outer circumferential surface of the pipe 110. The pipe 110 may be coupled to the side covers 35 and 36. The coupling port 150 may be formed inside each of the side covers 35 and 36. The pipe 110 may be inserted or forcibly fitted into the coupling ports 150, whereby the pipe 110 may be fixed to the side covers 35 and 36. The coupling port 150 may be referred to as an end coupler 150.

Figure 26:
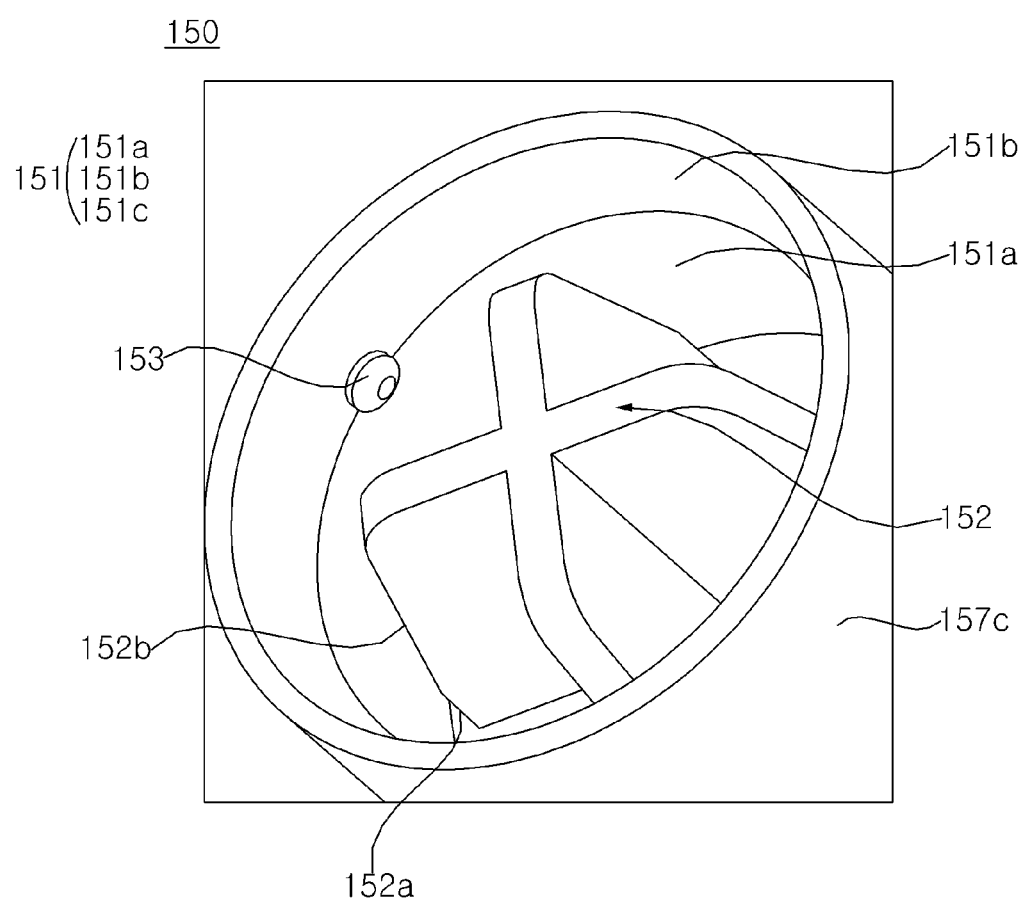
Figure 27:
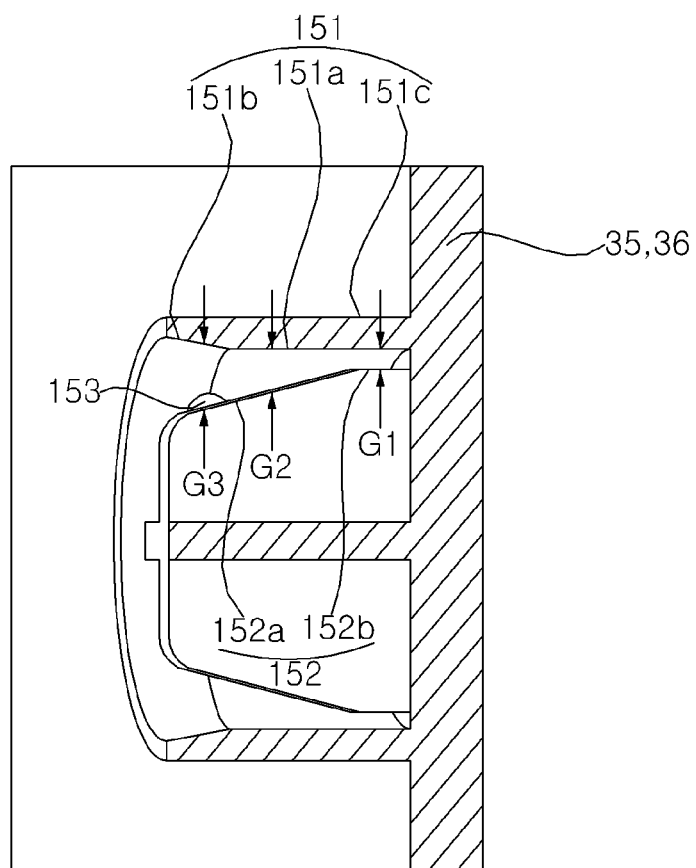

Referring to FIGS. 26 and 27, the coupling port 150 may have an outer cylinder 151 and an inner insert 152. The outer cylinder 151 may have a hollow cylindrical shape. The outer cylinder 151 may have an outer surface 151c, a first inner surface 151a, and a second inner surface 151b. The first inner surface 151a may be parallel to the outer surface 151c. The second inner surface 151b may extend from the first inner surface 151a to the distal end of the outer cylinder 151 in the state of being inclined. The diameter of the second inner surface 151b may gradually increase from the diameter of the first inner surface 151a to the diameter of the outer surface 151c. The second inner surface 151b may be referred to as a guide surface 151b, and the first inner surface 151a may be referred to as a forcible fitting surface 151a. A protrusion 153 may be formed inside the outer cylinder 151. For example, the protrusion 153 may be located at the border of the first inner surface 151a and the second inner surface 151b.

The inner insert 152 may be a rib extending from the side covers 35 and 36 (see FIG. 25) toward the distal end of the second inner surface 151b of the outer cylinder 151. The inner insert 152 may have a shape in which at least two ribs intersect. The inner insert 152 may have a first outer surface 152a and a second outer surface 152b. The first outer surface 152a may be spaced apart from the first inner surface 151a of the outer cylinder 151, and may be parallel to the first inner surface 151a of the outer cylinder 151. For example, the distance G1 between the first inner surface 151a of the outer cylinder 151 and the first outer surface 152a of the inner insert 152 may be substantially equal to or less than the thickness of the pipe 110. The second outer surface 152b of the inner insert 152 may extend from the first outer surface 152a to the distal end of the inner insert 152 in the state of being inclined. The second outer surface 152b of the inner insert 152 may be gradually distant from the first inner surface 151a and/or the second inner surface 151b of the outer cylinder 151. For example, the inner insert 152 may have a wedge shape. The second outer surface 152b of the inner insert 152 may face the first inner surface 151a and the second inner surface 151b of the outer cylinder 151.

The distance G1 between the first inner surface 151a of the outer cylinder 151 and the first outer surface 152a of the inner insert 152 may be less than the distance G2 between the first inner surface 151a of the outer cylinder 151 and the second outer surface 152b of the inner insert 152. The distance G2 between the first inner surface 151a of the outer cylinder 151 and the second outer surface 152b of the inner insert 152 may be less than the distance G3 between the second inner surface 151b of the outer cylinder 151 and the second outer surface 152b of the inner insert 152.

Figure 28:
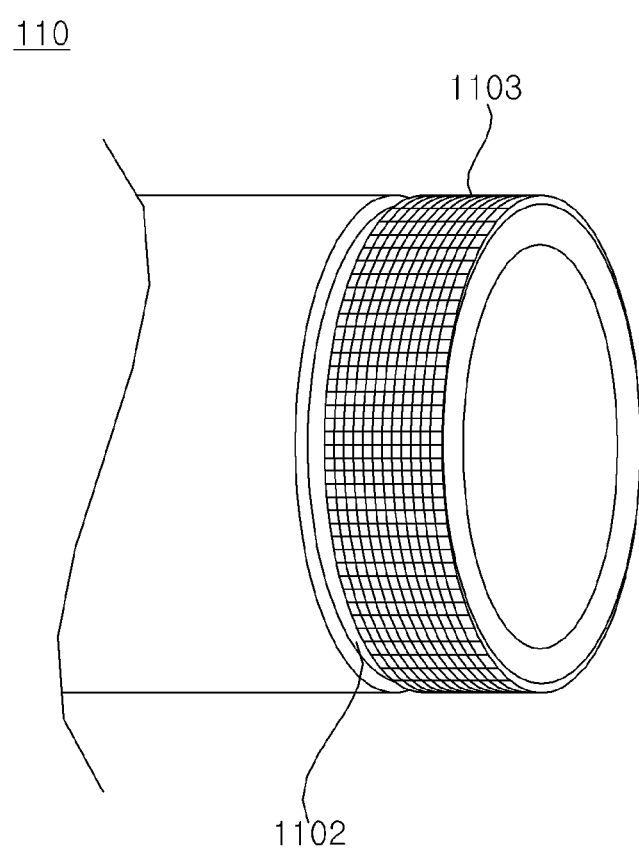
Figure 29:
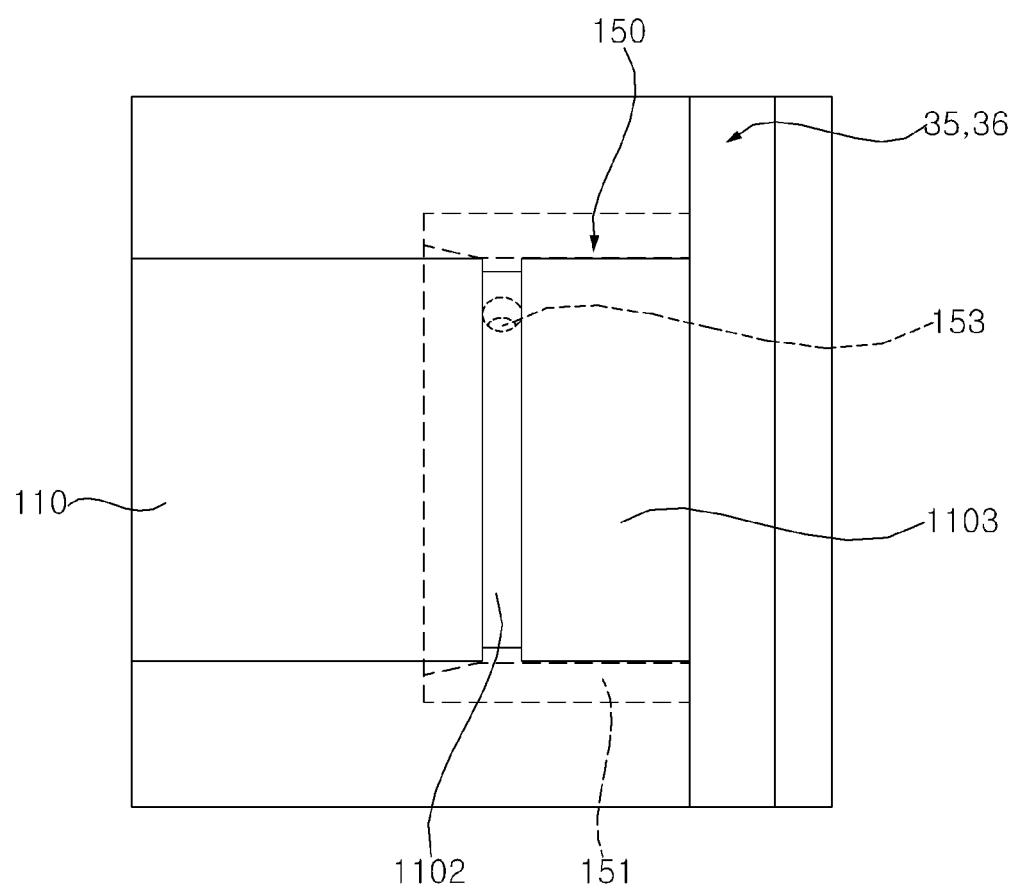

Referring to FIGS. 28 and 29, the pipe 110 may have a forcible fitting surface 1103. The forcible fitting surface 1103 may be formed at the outer surface of the pipe 110 between the neck 1102 of the pipe 110 and the distal end of the pipe 110. The forcible fitting surface 1103 may be a coarse surface. For example, the forcible fitting surface 1103 may be a knurling portion.

The pipe 110 may be inserted or forcibly fitted into the coupling port 150. The protrusion 153 may be inserted into the neck 1102 of the pipe 110. Consequently, fastening between the pipe 110 and the coupling port 150 may be more secured.

Figure 30:
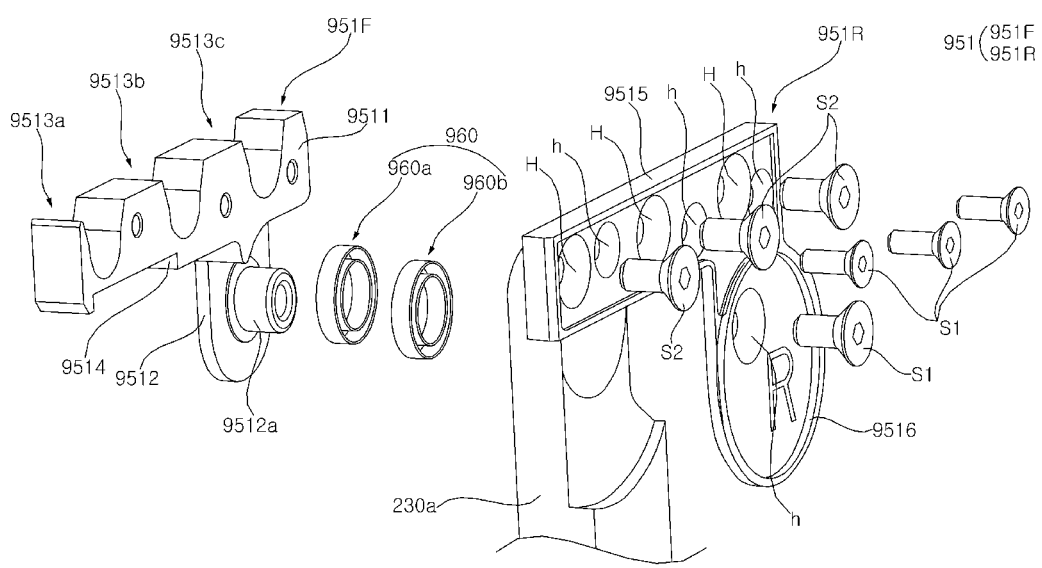

In FIGS. 30 to 33, the upward-downward direction UD and the leftward-rightward direction LR are described based on the state shown in FIGS. 30 to 33. Referring to FIG. 30, a link bracket 951 may be pivotably connected to the first arm 230a. The link bracket 951 may include a support 951F and a coupling plate 951R.

The support 951F may have a horizontal body 9511, a joint 9512 and 9512a, and cups 9513a, 9513b, and 9513c. The horizontal body 9511 may have a bar shape extending long leftwards and rightwards. The joint 9512 and 9512a may be formed at the lower side of the horizontal body 9511. The joint 9512 and 9512a may include a fixing plate 9512 and a pivot shaft 9512a.

A bearing 960 may be fastened to the pivot shaft 9512a. A plurality of bearings 960 may be provided. The plurality of bearings 960 may include a first bearing 960a and a second bearing 960b. The second bearing 960b may be stacked on the first bearing 960a. The first bearing 960a and the second bearing 960b may be fitted on the pivot shaft 9512a. Lubricating oil may be applied to the bearings 960. Assembly of the bearings 960 and application of lubricating oil to the bearings 960 may be performed simultaneously with coupling between the first arm 230a and the link bracket 951, but may be performed independently of fastening of other structures, whereby leakage of the lubricating oil may be prevented.

The fixing plate 9512 may be located at the lowers side of the horizontal body 9511 so as to be biased leftwards or rightwards. The fixing plate 9512 may extend long to the lower side of the horizontal body 9511. The pivot shaft 9512a may be formed so as to protrude from one surface of the fixing plate 9512.

The cups 9513a, 9513b, and 9513c may be formed as the result of the upper surface of the horizontal body 9511 being recessed. The cups 9513a, 9513b, and 9513c may be formed as the result of the upper surface of the horizontal body 9511 being recessed and at the same time the front surface and the rear surface of the horizontal body 9511 being open. For example, each of the cups 9513a, 9513b, and 9513c may generally have a U shape. The cups 9513a, 9513b, and 9513c may be sequentially disposed in the longitudinal direction of the horizontal body 9511. Consequently, it is possible to reduce concentration of stress and to eliminate fatigue fracture of the link bracket 951.

The coupling plate 951R may include a support cover 9515 and a joint cover 9516. The support cover 9515 may be a plate formed so as to have a length corresponding to the length of the support 951F. The joint cover 9516 may have the shape of a disc connected to the support cover 9515 at the lower side of the support cover 9515 in the state of being biased leftwards or rightwards. The coupling plate 951R may have a plurality of holes H and h.

The plurality of holes H and h may include first coupling holes h and second coupling holes H. The first coupling holes h may be provided for coupling between the support 951F, the coupling plate 951R, and first arms 911. The second coupling holes H may be provided for coupling between a top case 950 (see FIG. 31) and the link bracket 951.

Figure 31:
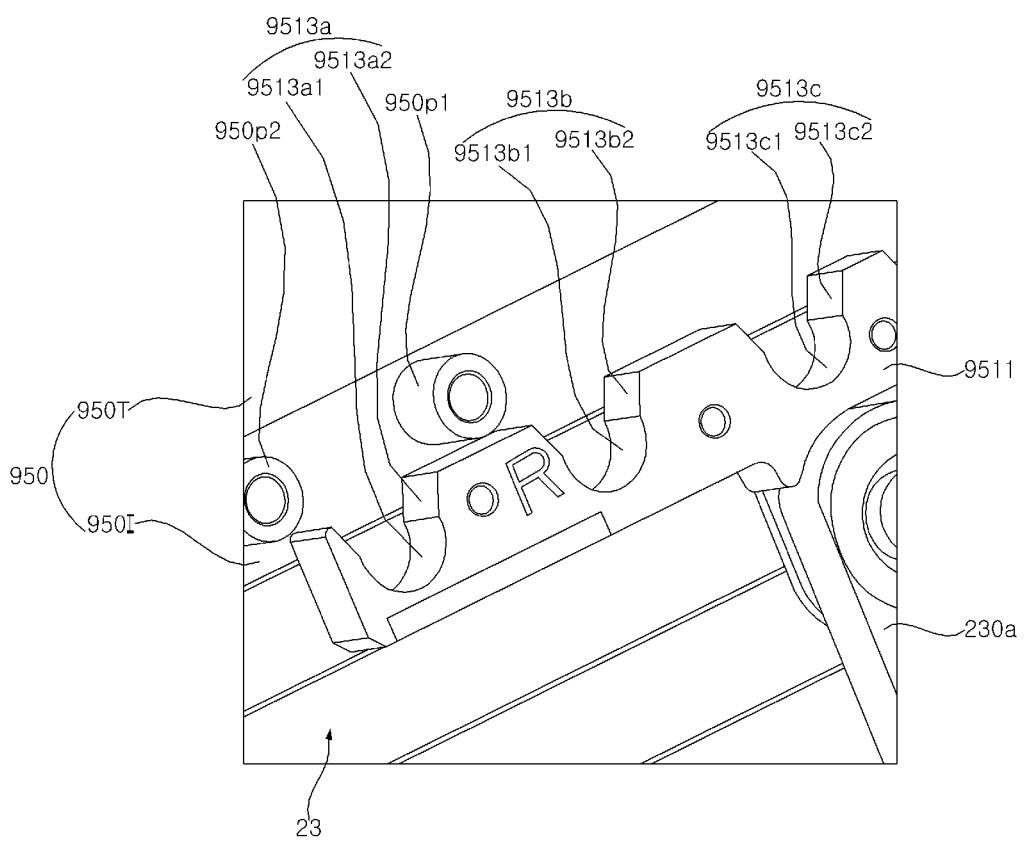

Referring to FIG. 31, the cup 9513a may include a support portion 9513a1 and a guide portion 9513a2. The support portion 9513a1 may form the lower side of the cup 9513a, and the guide portion 9513a2 may form the upper side of the cup 9513a. For example, the support portion 9513a1 may have a semicircular shape or a fan shape, and the guide portion 9513a2 may extend from the support portion 9513a1 and may have the shape of left and right sides of an inverted trapezoid.

The top case 950 may include an inner bar 950I and a top cover 950T. The inner bar 950I may be located at the upper side or the upper end of the module cover 23, and may be coupled to the module cover 23. Coupling protrusions 950P1, 950P2, and 950P3 may be mounted on the outer surface of the inner bar 950I. A plurality of coupling protrusions 950P1, 950P2, and 950P3 may be provided. The number of coupling protrusions 950P1, 950P2, and 950P3 may correspond to the number of cups 9513a, 9513b, and 9513c. For example, the coupling protrusions 950P1 and 950P2 may be PEM nuts. The radii of the coupling protrusions 950P1, 950P2, and 950P3 may correspond to the radii of support portions 9513a1, 9513b1, and 9513c1 of the cups 9513a, 9513b, and 9513c.

Figure 32:
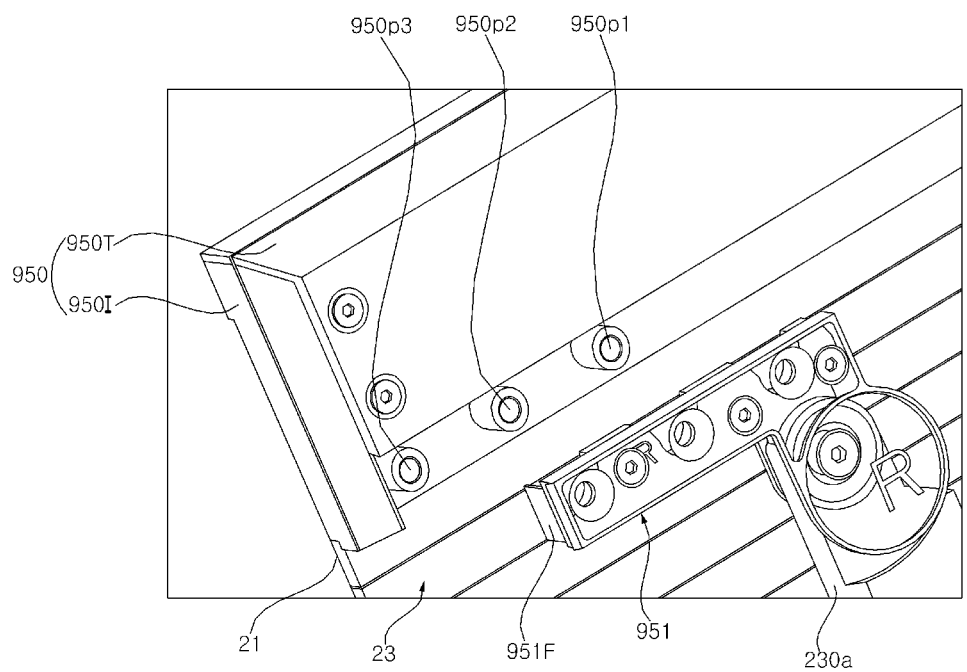
Figure 33:
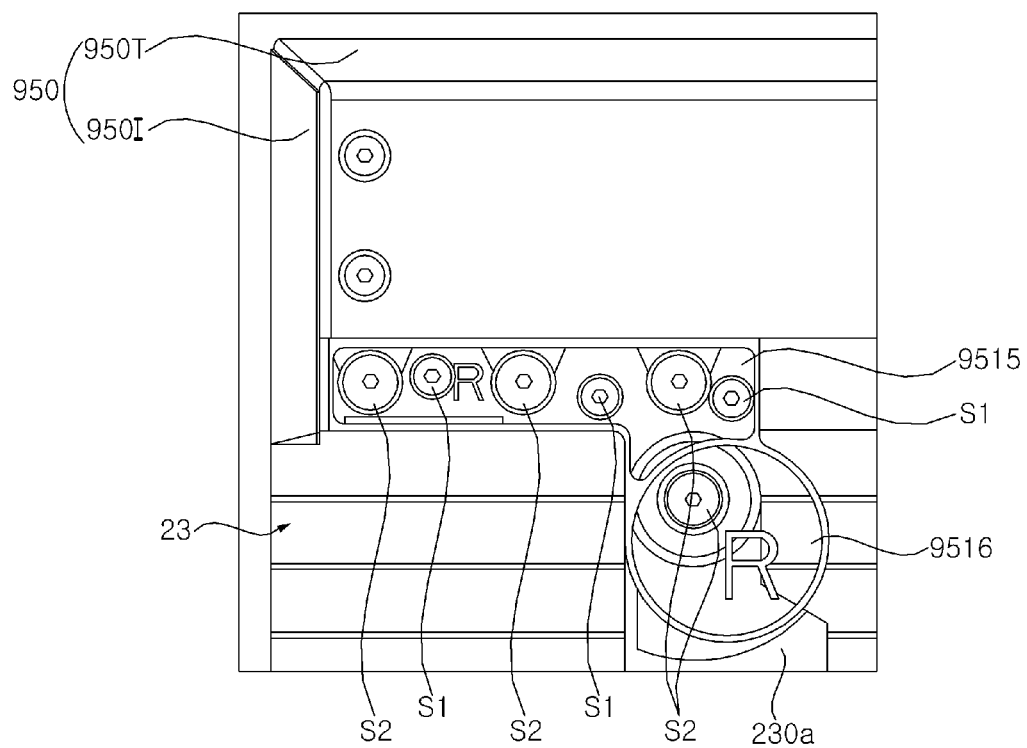

Referring to FIGS. 32 and 33, the link bracket 951 may be assembled with the top case 950 in the state in which the link bracket 951 is coupled to the first arm 230a. At this time, the link bracket 951 may move to the top case 950 according to motion of the links 220a and 230a (see FIG. 34) in the upward-downward direction. As the support 951F of the link bracket 951 approaches the top case 950, the coupling protrusions 950P1, 950P2, and 950P3 may be inserted into the cups 9513a, 9513b, and 9513c (see FIG. 31) of the support 951F. The coupling protrusions 950P1, 950P2, and 950P3 may be inserted into the cups 9513a, 9513b, and 9513c of the support 951F, and the link bracket 951 and the top case 960 may be fastened to each other via screws S2 (see FIG. 30).

Consequently, the link bracket 951 may be naturally coupled to the top case 960 within a movable range of the links 220 and 230 without straining the joints of the links 220 and 230.

Figure 34:
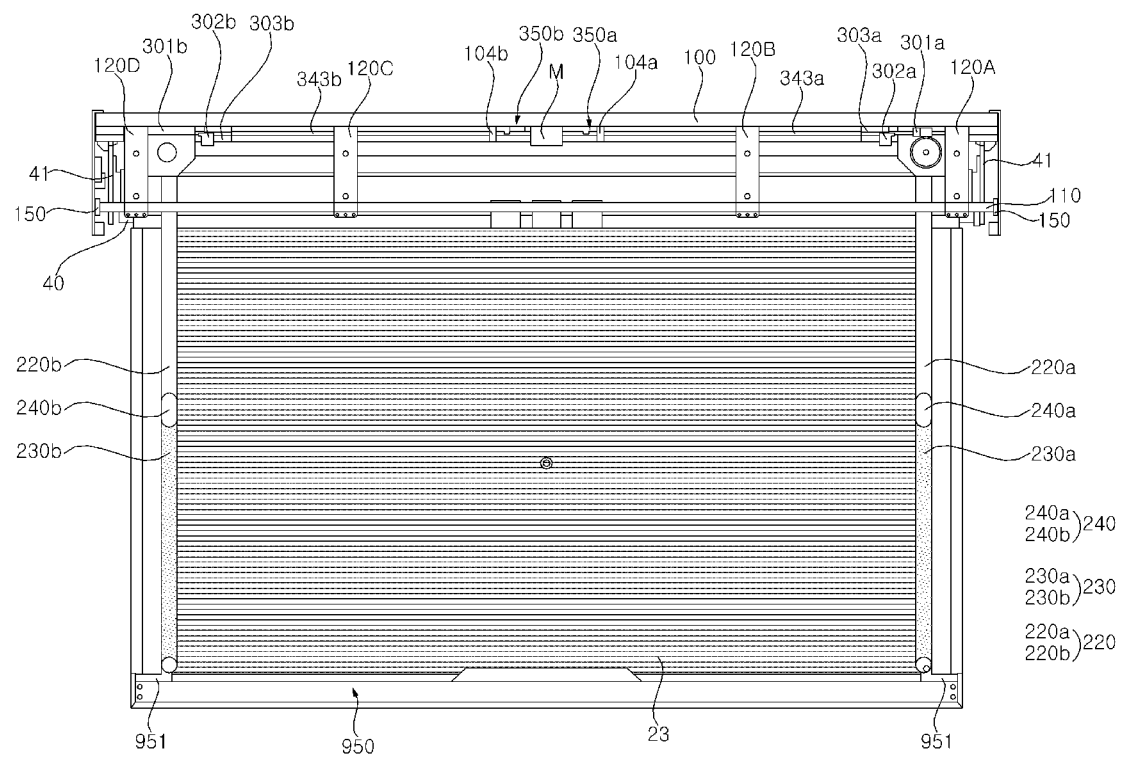

Referring to FIG. 34, the driving shaft 343a may transmit power provided by the motor M to the third gear box 303a. The driving shaft 343b may transmit power provided by the motor M to the third gear box 303b. The driving shaft 343a may receive power from the motor M via the joint 350a while being supported by the support 104a, and the driving shaft 343b may receive power from the motor M via the joint 350b while being supported by the support 104b.

The links 220a, 230a, and 240a may be pivotably connected to the link mount 210a (see FIG. 18), and may move downwards while being unfolded or upwards while being folded. The links 220b, 230b, and 240b may be pivotably connected to the link mount 210b, and may move downwards while being unfolded or upwards while being folded. The links 220a, 230a, and 240a and the links 220b, 230b, and 240b may move downwards to the same height while being unfolded or upwards to the same height while being folded.

Consequently, power transmission of the display device may be achieved in the minimum space at high efficiency. In addition, the display panel 21 (see FIG. 10) and the module cover 23 may be maintained flat in the state in which the display panel 21 and the module cover 23 are unwound from the panel roller 40 and the links 220, 230, and 240 move downwards.

In accordance with an aspect of the present disclosure, provided is a display device including a flexible display panel, a panel roller, wherein the flexible display panel is wound around or unwound from the panel roller, a frame extending in a longitudinal direction with respect to the panel roller, wherein the panel roller is coupled to the frame, a first foldable link comprising one end pivotably coupled to the frame and another end pivotably coupled adjacent to a lower side of the flexible display panel, a second foldable link having one end pivotably coupled to the frame and the other end pivotably coupled adjacent to the lower side of the flexible display panel, wherein the second foldable link is located opposite to the first foldable link, a motor mounted to the frame between the first foldable link and the second foldable link, a first gear box mounted to the frame adjacent to the first foldable link, and comprising at least one gear configured to cause the first foldable link to pivot, a second gear box mounted to the frame adjacent to the second foldable link, and comprising at least one gear configured to pivot with respect to the second foldable link, and a driving shaft configured to transmit power provided by the motor to the at least one gear of the first gear box or to the at least one gear of the second gear box.

In accordance with another aspect of the present disclosure, the display device may further include a first link bracket mounted to the frame, wherein one end of the first foldable link may be pivotably connected to the first link bracket, and a second link bracket mounted to the frame, wherein one end of the second foldable link may be pivotably connected to the second link bracket.

In accordance with another aspect of the present disclosure, the first gear box may include a first link gear configured to rotate with a pivot shaft of the one end of the first foldable link, and the second gear box may include a second link gear configured to rotate with a pivot shaft of the one end of the second foldable link.

In accordance with another aspect of the present disclosure, the first gear box may further include a first worm gear engaged with the first link gear, wherein the first worm gear may be configured to rotate in a same direction with respect to a rotational direction of the driving shaft, and the second gear box may further include a second worm gear engaged with the second link gear, wherein the second worm gear may be configured to rotate in a same direction with respect to a rotational direction of the driving shaft.

In accordance with another aspect of the present disclosure, the first gear box may further include a first transmission shaft inserted into the first worm gear, wherein the first transmission shaft may be configured to rotate with the first worm gear, the second gear box may further include a second transmission shaft inserted into the second worm gear, wherein the second transmission shaft may be configured to rotate with the second worm gear, and the first transmission shaft and the second transmission shaft may receive power from the driving shaft.

In accordance with another aspect of the present disclosure, the first gear box may further include a first transmission gear fitted on the first transmission shaft, wherein the first transmission gear may be configured to rotate with the first transmission shaft; and a first driving gear fitted on the driving shaft, wherein the first driving gear may be configured to rotate with the driving shaft and may be engaged with the first transmission gear, and the second gear box may further include a second transmission gear fitted on the second transmission shaft, wherein the second transmission gear may be configured to rotate with the second transmission shaft, and a second driving gear fitted on the driving shaft, wherein the second driving gear may be configured to rotate with the driving shaft and may be engaged with the second transmission gear.

In accordance with another aspect of the present disclosure, a rotational speed of the driving shaft may be higher than a rotational speed of each of the first transmission shaft and the second transmission shaft.

In accordance with another aspect of the present disclosure, the display device may further include a sensor plate fixed to the driving shaft, wherein the sensor plate may be configured to rotate with the driving shaft, and a sensor located adjacent to the sensor plate, wherein the sensor may be configured to determine a rotation of the sensor plate.

In accordance with another aspect of the present disclosure, the display device may further include a module cover extending in the longitudinal direction of the panel roller, wherein the module cover may comprise a plurality of segments arranged at a rear surface of the flexible display panel in an vertical direction with respect to the flexible display panel, wherein the flexible display panel and the module cover may be wound around or unwound from the panel roller.

In accordance with another aspect of the present disclosure, the flexible display panel may move downwards while being unwound from the panel roller and may move upwards while being wound around the panel roller.

As is apparent from the above description, a display device according to the present disclosure has the following effects.

According to at least one of the embodiments of the present disclosure, it is possible to secure structural rigidity for preventing drooping of a display device.

According to at least one of the embodiments of the present disclosure, it is possible to secure structural rigidity for preventing twisting of the display device.

According to at least one of the embodiments of the present disclosure, it is possible to provide a driving mechanism of a rollable display device.

The additional scope of applicability of the present disclosure will be apparent from the above detailed description. However, those skilled in the art will appreciate that various modifications and alterations are possible, without departing from the idea and scope of the present disclosure, and therefore it should be understood that the detailed description and specific embodiments, such as the preferred embodiments of the present disclosure, are provided only for illustration.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
    a display panel;
    a frame positioned adjacent to the display panel;
    a first link comprising one end pivotably coupled to the frame and an other end coupled adjacent to one edge of the display panel;
    a motor mounted to the frame;
    a driving shaft fixed to a rotational shaft of the motor;
    a first worm gear configured to rotate in a same direction with respect to a rotational direction of the driving shaft; and
    a first link gear engaged with the first worm gear and configured to rotate with a pivot shaft of the one end of the first link.

2. The display device according to claim 1, further comprising a second link comprising one end pivotably coupled to the frame and an other end coupled adjacent to the one edge of the display panel, wherein the second link is positioned opposite to the first link.

3. The display device according to claim 2, further comprising:
- a second worm gear configured to rotate in a same direction with respect to the rotational direction of the driving shaft; and
- a second link gear engaged with the second worm gear and configured to rotate with a pivot shaft of the one end of the second link.

4. The display device according to claim 3, wherein the motor is mounted to the frame between the first link and the second link.

5. The display device according to claim 1, wherein the first link is foldable, and the other end of the first link is pivotably coupled adjacent to the one edge of the display panel.

6. The display device according to claim 5, wherein the first link comprises:
- a first arm defining the other end of the first link;
- a second arm intersecting the first arm and defining the one end of the first link; and
- a joint connecting the first arm and the second arm between the first arm and the second arm.

7. The display device according to claim 1, further comprising a first link bracket mounted to the frame, wherein the one end of the first link is pivotably connected to the first link bracket.

8. The display device according to claim 7, further comprising a first transmission shaft inserted into the first worm gear, wherein the first transmission shaft is configured to rotate with the first worm gear, and
  wherein the first transmission shaft receives power from the driving shaft.

9. The display device according to claim 8, further comprising:
- a first transmission gear fitted on the first transmission shaft, wherein the first transmission gear is configured to rotate with the first transmission shaft; and
- a first driving gear fitted on the driving shaft, wherein the first driving gear is configured to rotate with the driving shaft and is engaged with the first transmission gear.

10. The display device according to claim 9, wherein a rotational speed of the driving shaft is higher than a rotational speed of the first transmission shaft.

11. The display device according to claim 10, further comprising:
- a sensor plate fixed to the driving shaft, wherein the sensor plate is configured to rotate with the driving shaft; and
- a sensor positioned adjacent to the sensor plate, wherein the sensor is configured to determine a rotation of the sensor plate.

12. The display device according to claim 1, wherein, according to a pivoting of the first link, a position of the one edge of the display panel is varied in a direction perpendicular to the one edge and the pivot shaft.

* * * * *